United States Patent
Aoki

(10) Patent No.: US 9,917,315 B2
(45) Date of Patent: Mar. 13, 2018

(54) STATE DETERMINATION DEVICE AND METHOD FOR FUEL CELL

(71) Applicant: NISSAN MOTOR CO., LTD., Yokohama-shi, Kanagawa (JP)

(72) Inventor: Tetsuya Aoki, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 15/524,104

(22) PCT Filed: Nov. 7, 2014

(86) PCT No.: PCT/JP2014/079633
§ 371 (c)(1),
(2) Date: May 3, 2017

(87) PCT Pub. No.: WO2016/072026
PCT Pub. Date: May 12, 2016

(65) Prior Publication Data
US 2017/0324104 A1    Nov. 9, 2017

(51) Int. Cl.
*H01M 8/04* (2016.01)
*H01M 8/0444* (2016.01)
(Continued)

(52) U.S. Cl.
CPC ... *H01M 8/04447* (2013.01); *H01M 8/04559* (2013.01); *H01M 8/04589* (2013.01);
(Continued)

(58) Field of Classification Search
CPC ......... H01M 8/04447; H01M 8/04641; H01M 8/04992; H01M 8/10; H01M 8/04589; H01M 8/04559; H01M 8/04649
See application file for complete search history.

(56) References Cited

U.S. PATENT DOCUMENTS

2005/0208349 A1    9/2005  Inai et al.
2007/0172708 A1*   7/2007  Takebe ............... G01R 31/3679
                                                            429/431
(Continued)

FOREIGN PATENT DOCUMENTS

EP    1 923 945 A1    5/2008
JP    2003-331895 A   11/2003
(Continued)

OTHER PUBLICATIONS

Parthasarathy M. Gomadam et al., Analysis of Electrochemical Impedance Spectroscopy in Proton Exchange Membrane Fuel Cells, International Journal of Energy Research, vol. 29, No. 12, Oct. 10, 2005, pp. 1133-1151.

*Primary Examiner* — Stewart A Fraser
(74) *Attorney, Agent, or Firm* — Foley & Lardner LLP

(57) ABSTRACT

A state determination device for a fuel cell for generating power upon receiving the supply of anode gas and cathode gas, comprising: an internal impedance measurement unit configured to measure an internal impedance of the fuel cell on the basis of an alternating-current signal of a predetermined frequency output from the fuel cell; and an anode reaction resistance estimation/calculation unit configured to calculate an estimation value of a reaction resistance of an anode electrode of the fuel cell on the basis of a measurement value of the internal impedance, wherein: the predetermined frequency is selected such that a difference between the estimation value of the reaction resistance of the anode electrode during hydrogen starvation and the estimation value of the reaction resistance of the anode electrode during oxygen starvation is not smaller than a predetermined value.

12 Claims, 14 Drawing Sheets

(51) Int. Cl.
  *H01M 8/10*      (2016.01)
  *H01M 8/04537*   (2016.01)
  *H01M 8/04992*   (2016.01)

(52) U.S. Cl.
  CPC ... *H01M 8/04641* (2013.01); *H01M 8/04649* (2013.01); *H01M 8/04992* (2013.01); *H01M 8/10* (2013.01)

(56) References Cited

U.S. PATENT DOCUMENTS

| | | | |
|---|---|---|---|
| 2009/0061263 A1* | 3/2009 | Watanabe | B60L 11/1881 429/431 |
| 2010/0141262 A1* | 6/2010 | Watanabe | H01M 8/04119 324/430 |
| 2012/0038373 A1 | 2/2012 | Ikeda et al. | |
| 2012/0145564 A1* | 6/2012 | Yamazaki | H01M 8/04641 205/790.5 |
| 2014/0162151 A1* | 6/2014 | Mohri | H01M 8/04835 429/413 |
| 2015/0024295 A1* | 1/2015 | Hibino | H01M 8/04835 429/413 |

FOREIGN PATENT DOCUMENTS

| | | |
|---|---|---|
| JP | 2007-048559 A | 2/2007 |
| JP | 2007-052988 A | 3/2007 |
| JP | 2013-008568 | 1/2013 |
| JP | 2013-125604 A | 6/2013 |
| JP | 2013-140715 A | 7/2013 |
| JP | 2013-258043 A | 12/2013 |
| JP | 2015-22884 A | 2/2015 |
| WO | WO 2010/128555 A1 | 11/2010 |

* cited by examiner

STATE DETERMINATION DEVICE AND METHOD FOR FUEL CELL

TECHNICAL FIELD

This invention relates to state determination device and method for fuel cell.

BACKGROUND ART

It is a known technique to measure a voltage value and an impedance value of a fuel cell and determine an abnormality on the basis of these values. For example, a shortage or lack of hydrogen gas in an anode electrode (hydrogen starvation), a shortage or lack of oxygen in a cathode electrode (oxygen starvation), the drying of an electrolyte membrane (dry-out) and the like are considered abnormalities of the fuel cell. It is necessary to properly determine the hydrogen starvation, as it is a particularly important problem out of these events considered as abnormalities of the fuel cell.

A hydrogen concentration measurement method for estimating that a hydrogen concentration of an anode is relatively low (i.e. a hydrogen starvation state) when an arc of an internal impedance of a fuel cell drawn in a so-called Cole-Cole plot diagram is relatively large is proposed in WO 2010/128555.

SUMMARY OF INVENTION

It is thought that, if the hydrogen starvation occurs, the value of the internal impedance of the entire fuel cell increases and the arc of the internal impedance certainly becomes larger. However, it cannot be concluded that a relative increase of the arc of the internal impedance is due to the hydrogen starvation. For example, the arc of the internal impedance may become larger also due to a reduction in the oxygen concentration of a cathode in some cases. Thus, it is difficult to distinguish the hydrogen starvation from other causes as a factor in an increase of the internal impedance by the aforementioned conventional hydrogen concentration measurement method, and the reliability of determining hydrogen starvation has been unreliable.

The present invention was developed focusing on such a problem, and aims to provide a state determination device and method for fuel cells, capable of determining hydrogen starvation with a high reliability.

According to one aspect of the present invention, the present invention provides a state determination device for a fuel cell for generating power upon receiving the supply of anode gas and cathode gas. The state determination device includes an internal impedance measurement unit configured to measure an internal impedance of the fuel cell on the basis of an alternating-current signal of a predetermined frequency output from the fuel cell. The state determination device further includes an anode reaction resistance estimation/calculation unit configured to calculate an estimation value of a reaction resistance of an anode electrode of the fuel cell on the basis of a measurement value of the internal impedance. Furthermore, the predetermined frequency is selected such that a difference between the estimation value of the reaction resistance of the anode electrode during hydrogen starvation and the estimation value of the reaction resistance of the anode electrode during oxygen starvation is not smaller than a predetermined value.

DESCRIPTION OF EMBODIMENTS

Hereinafter, embodiments of the present invention are described with reference to the drawings and the like.

A fuel cell is configured such that an electrolyte membrane is sandwiched by an anode electrode serving as a fuel electrode and a cathode electrode serving as an oxidant electrode. The fuel cell generates power using anode gas containing hydrogen supplied to the anode electrode and cathode gas containing oxygen supplied to the cathode electrode. Electrode reactions which proceed in both anode and cathode electrodes are as follows.

Anode electrode:   (1)

Cathode electrode: 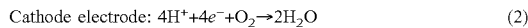  (2)

The fuel cell generates an electromotive force of about 1 V (volt) by these electrode reactions (1) and (2). Here, since the above reactions (1) and (2) are reversible reactions, reactions opposite to the above ones (1) and (2) can be normally caused by, for example, applying a voltage having a sign opposite to the one in the case of using the fuel cell while connecting the fuel cell to a load such as by setting the potential of the anode electrode higher than that of the cathode electrode by a predetermined value or larger. Thus, by applying an alternating-current voltage to the fuel cell as described above, the reactions expressed by the above formulae (1) and (2) and the reactions opposite to the former reactions are alternately switched in response to a positive/negative variation of this alternating-current voltage.

Figure 1:
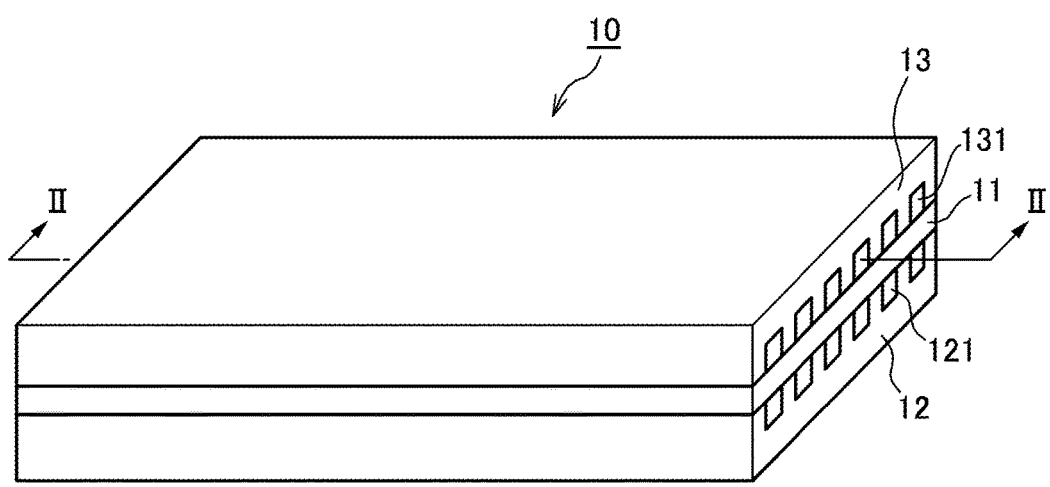
FIG. 1 is a perspective view of a fuel cell according to an embodiment of the present invention.
Figure 2:
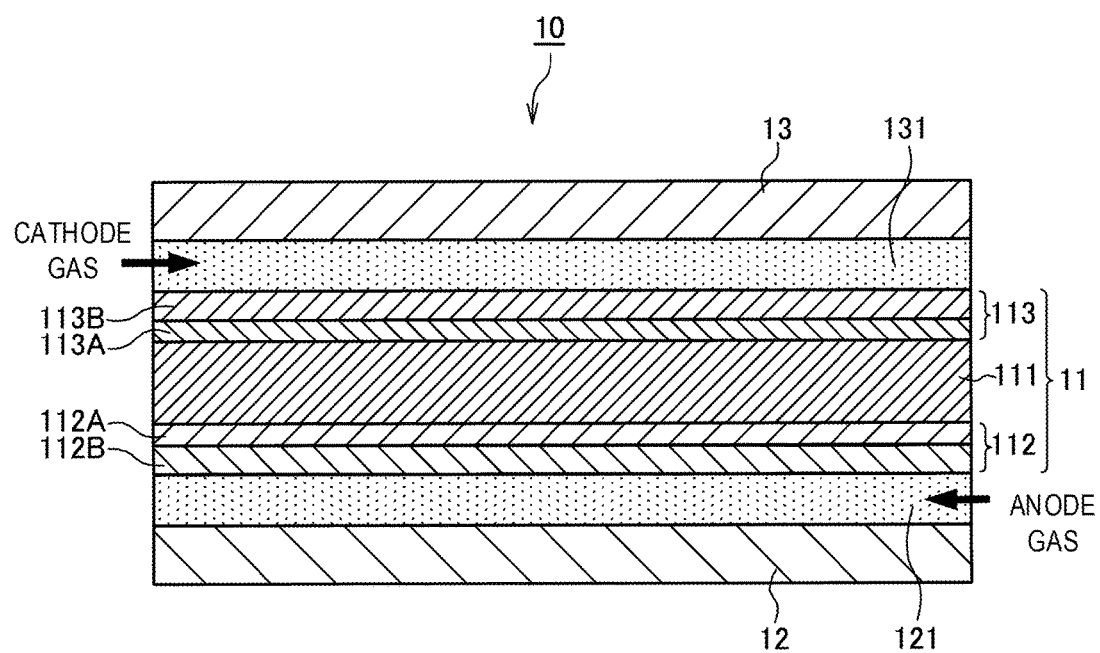
FIG. 2 is a sectional view along II-II of the fuel cell of FIG. 1.

FIGS. 1 and 2 are views showing the configuration of a fuel cell 10 according to one embodiment of the present invention. FIG. 1 is a perspective view of the fuel cell 10. FIG. 2 is a sectional view along II-II of the fuel cell 10 of FIG. 1.

As shown in FIGS. 1 and 2, the fuel cell 10 includes a membrane electrode assembly (MEA) 11, and an anode separator 12 and a cathode separator 13 arranged to sandwich the MEA 11.

The MEA 11 is composed of an electrolyte membrane 111, an anode electrode 112 and a cathode electrode 113. The MEA 11 includes the anode electrode 112 on one surface side of the electrolyte membrane 111 and the cathode electrode 113 on the other surface side.

The electrolyte membrane 111 is a proton conductive ion exchange membrane formed of fluororesin. The electrolyte membrane 111 exhibits good electrical conductivity in a wet state. It should be noted that another material such as, for example, a material having a phosphoric acid ($H_3PO_4$) impregnated in a predetermined matrix may be used according to a possible response of the fuel cell.

The anode electrode 112 includes a catalyst layer 112A and a gas diffusion layer 112B. The catalyst layer 112A is a member formed of platinum or carbon black particles carrying platinum or the like and provided in contact with the electrolyte membrane 111. The gas diffusion layer 112B is provided on an outer side of the catalyst layer 112A. The gas diffusion layer 112B is a member formed of carbon cloth having gas diffusion property and electrical conductivity and provided in contact with the catalyst layer 112A and the anode separator 12.

Similarly to the anode electrode 112, the cathode electrode 113 also includes a catalyst layer 113A and a gas diffusion layer 113B. The catalyst layer 113A is arranged between the electrolyte membrane 111 and the gas diffusion layer 113B, and the gas diffusion layer 113B is arranged between the catalyst layer 113A and the cathode separator 13.

The anode separator 12 is arranged on an outer side of the gas diffusion layer 112B. The anode separator 12 includes a plurality of anode gas flow passages 121 for supplying anode gas (hydrogen gas) to the anode electrode 112. The anode gas flow passages 121 are formed as groove-like passages.

The cathode separator 13 is arranged on an outer side of the gas diffusion layer 113B. The cathode separator 13 includes a plurality of cathode gas flow passages 131 for supplying cathode gas (air) to the cathode electrode 113. The cathode gas flow passages 131 are formed as groove-like passages.

The anode separator 12 and the cathode separator 13 are configured such that the anode gas flowing in the anode gas flow passages 121 and the cathode gas flowing in the cathode gas flow passages 131 flow in directions opposite to each other. It should be noted that the anode separator 12 and the cathode separator 13 may be so configured that these gases flow in the same direction.

In the case of using such a fuel cell 10 as a power source for an automotive vehicle, a fuel cell stack in which several hundreds of fuel cells 10 are laminated is used since required power is large. Power for driving the vehicle is extracted by configuring a fuel cell system for supplying anode gas and cathode gas to the fuel cell stack. It should be noted that although an impedance measurement to be described later is conducted for each fuel cell stack in which the fuel cells 10 are laminated in the present embodiment, the impedance measurement may be conducted for each fuel cell 10, or for each part (e.g. several tens of cells) of the fuel cell stack.

Further, in the fuel cell stack, an anode electrode, a cathode electrode and an electrolyte membrane serving as sums are configured by arranging the anode electrodes 112, the cathode electrodes 113 and the electrolyte membranes 111 of a plurality of the fuel cells 10 in series. However, for the convenience of description, these anode electrode, cathode electrode and electrolyte membrane serving as the sums are also denoted by the same reference signs as the anode electrode 112, the cathode electrode 113 and the electrolyte membrane 111 of the single cell.

Figure 3:
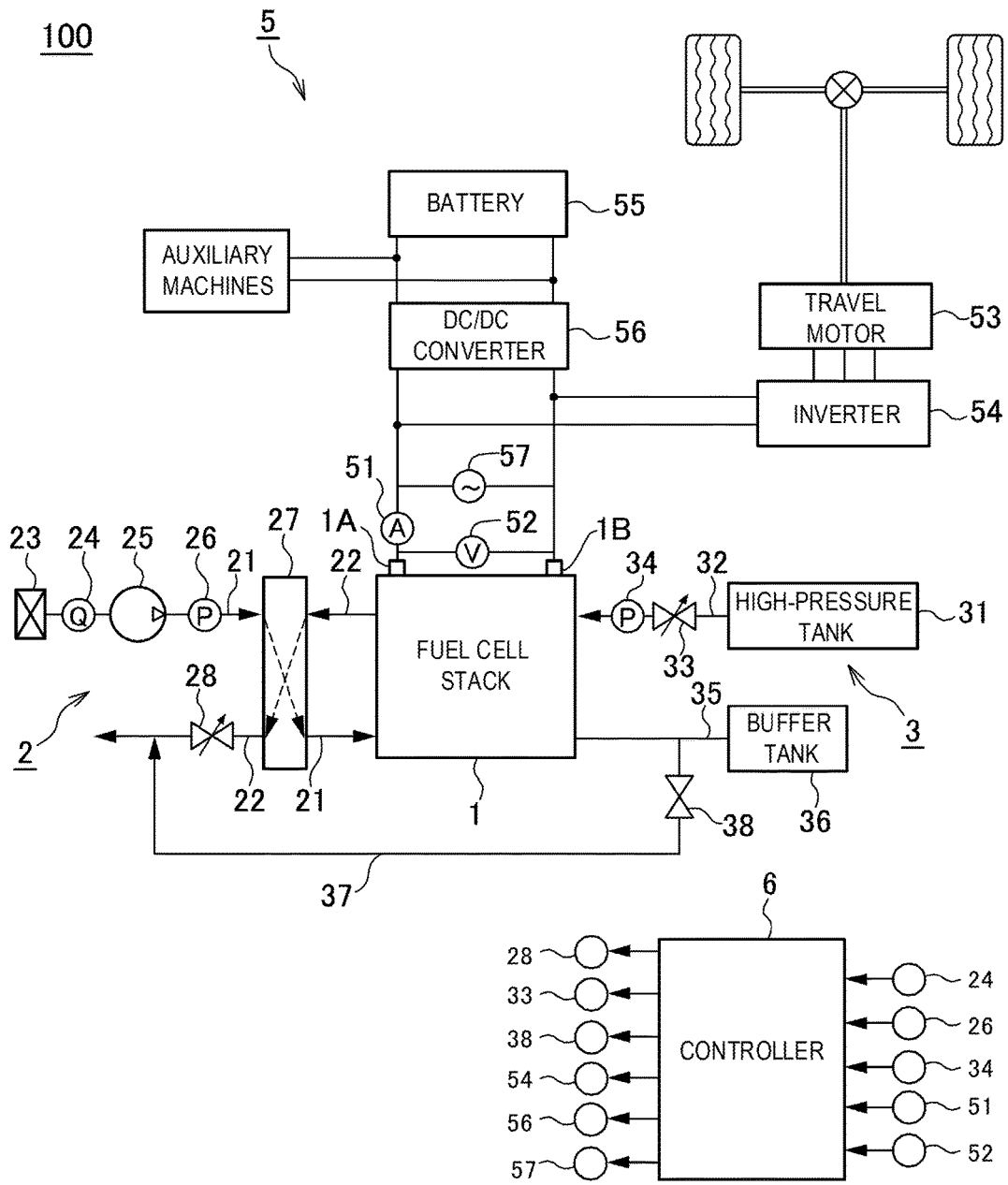
FIG. 3 is a schematic configuration diagram of a fuel cell system according to the embodiment of the present invention.

FIG. 3 is a schematic diagram of a fuel cell system 100 according to one embodiment of the present invention.

The fuel cell system 100 includes a fuel cell stack 1, a cathode gas supplying/discharging device 2, an anode gas supplying/discharging device 3, a power system 5 and a controller 6.

The fuel cell stack 1 is a laminated battery formed by laminating a plurality of fuel cells 10 (unit cells) as described above. The fuel cell stack 1 generates power necessary to drive a vehicle upon receiving the supply of the anode gas and the cathode gas. The fuel cell stack 1 includes an anode electrode side terminal 1A and a cathode electrode side terminal 1B as output terminals for extracting power.

The cathode gas supplying/discharging device 2 supplies the cathode gas to the fuel cell stack 1 and discharges cathode off-gas discharged from the fuel cell stack 1 to outside. The cathode gas supplying/discharging device 2 includes a cathode gas supply passage 21, a cathode gas discharge passage 22, a filter 23, an air flow sensor 24, a cathode compressor 25, a cathode pressure sensor 26, a water recovery device (WRD) 27 and a cathode pressure control valve 28.

The cathode gas supply passage 21 is a passage in which the cathode gas to be supplied to the fuel cell stack 1 flows. One end of the cathode gas supply passage 21 is connected to the filter 23 and the other end is connected to a cathode gas inlet part of the fuel cell stack 1.

The cathode gas discharge passage 22 is a passage in which the cathode off-gas discharged from the fuel cell stack 1 flows. One end of the cathode gas discharge passage 22 is connected to a cathode gas outlet part of the fuel cell stack 1 and the other end is formed as an opening end. The cathode off-gas is mixture gas containing the cathode gas, steam produced by the electrode reaction and the like.

The filter 23 is a member for removing dust, dirt and the like contained in the cathode gas to be taken into the cathode gas supply passage 21.

The cathode compressor 25 is provided downstream of the filter 23 in the cathode gas supply passage 21. The cathode compressor 25 supplies the cathode gas in the cathode gas supply passage 21 to the fuel cell stack 1 by feeding the cathode gas under pressure.

The air flow sensor 24 is provided between the filter 23 and the cathode compressor 25 in the cathode gas supply passage 21. The air flow sensor 24 detects a flow rate of the cathode gas to be supplied to the fuel cell stack 1.

The cathode pressure sensor 26 is provided between the cathode compressor 25 and the WRD 27 in the cathode gas supply passage 21. The cathode pressure sensor 26 detects a pressure of the cathode gas to be supplied to the fuel cell stack 1. The cathode gas pressure detected by the cathode pressure sensor 26 represents a pressure of an entire cathode system including the cathode gas flow passages of the fuel cell stack 1 and the like.

The WRD 27 is connected over the cathode gas supply passage 21 and the cathode gas discharge passage 22. The WRD 27 is a device for recovering moisture in the cathode off-gas flowing in the cathode gas discharge passage 22 and humidifying the cathode gas flowing in the cathode gas supply passage 21 with that recovered moisture.

The cathode pressure control valve 28 is provided downstream of the WRD 27 in the cathode gas discharge passage 22. The cathode pressure control valve 28 is controlled by the controller 6 to open and close, and adjusts the pressure of the cathode gas to be supplied to the fuel cell stack 1.

Next, the anode gas supplying/discharging device 3 is described.

The anode gas supplying/discharging device 3 supplies the anode gas to the fuel cell stack 1 and discharges anode off-gas discharged from the fuel cell stack 1 to the cathode gas discharge passage 22. The anode gas supplying/discharging device 3 includes a high-pressure tank 31, an anode gas supply passage 32, an anode pressure control valve 33, an anode pressure sensor 34, an anode gas discharge passage 35, a buffer tank 36, a purge passage 37 and a purge valve 38.

The high-pressure tank 31 is a container for storing the anode gas to be supplied to the fuel cell stack 1 in a high-pressure state.

The anode gas supply passage 32 is a passage for supplying the anode gas discharged from the high-pressure tank 31 to the fuel cell stack 1. One end of the anode gas supply passage 32 is connected to the high-pressure tank 31 and the other end is connected to an anode gas inlet part of the fuel cell stack 1.

The anode pressure control valve 33 is provided downstream of the high-pressure tank 31 in the anode gas supply passage 32. The anode pressure control valve 33 is controlled by the controller 6 to open and close and adjusts a pressure of the anode gas to be supplied to the fuel cell stack 1.

The anode pressure sensor 34 is provided downstream of the anode pressure control valve 33 in the anode gas supply passage 32. The anode pressure sensor 34 detects a pressure of the anode gas to be supplied to the fuel cell stack 1. The anode gas pressure detected by the anode pressure sensor 34 represents a pressure of an entire anode system including the buffer tank 36, the anode gas flow passages of the fuel cell stack 1 and the like.

The anode gas discharge passage 35 is a passage in which the anode off-gas discharged from the fuel cell stack 1 flows. One end of the anode gas discharge passage 35 is connected to an anode gas outlet part of the fuel cell stack 1 and the other end is connected to the buffer tank 36. The anode off-gas contains the anode gas not used in the electrode reaction, impurity gas such as nitrogen having leaked from the cathode gas flow passages 131 to the anode gas flow passages 121, moisture and the like.

The buffer tank 36 is a container for temporarily storing the anode off-gas flowing from the anode gas discharge passage 35. The anode off-gas pooled in the buffer tank 36 is discharged to the cathode gas discharge passage 22 through the purge passage 37 when the purge valve 38 is opened.

The purge passage 37 is a passage for discharging the anode off-gas. One end of the purge passage 37 is connected to the anode gas discharge passage 35 and the other end is connected to a part of the cathode gas discharge passage 22 downstream of the cathode pressure control valve 28.

The purge valve 38 is provided in the purge passage 37. The purge valve 38 is controlled by the controller 6 to open and close and controls a purge flow rate of the anode off-gas discharged from the anode gas discharge passage 35 to the cathode gas discharge passage 22.

When a purge control is executed to open the purge valve 38, the anode off-gas is discharged to the outside through the purge passage 37 and the cathode gas discharge passage 22. At this time, the anode off-gas is mixed with the cathode off-gas in the cathode gas discharge passage 22. By mixing the anode off-gas and the cathode off-gas and discharging the mixture gas to outside in this way, an anode gas concentration (hydrogen concentration) in the mixture gas is set at a value not larger than an allowable discharge concentration.

The power system 5 includes a current sensor 51, a voltage sensor 52, a travel motor 53, an inverter 54, a battery 55, a DC/DC converter 56 and an alternating-current power supply 57.

The current sensor 51 detects an output current extracted from the fuel cell stack 1. The voltage sensor 52 detects an output voltage of the fuel cell stack 1, i.e. an inter-terminal voltage between the anode electrode side terminal 1A and the cathode electrode side terminal 1B. The voltage sensor 52 may be configured to detect a voltage of each fuel cell 10 or may be configured to detect a voltage of each group composed of a plurality of the fuel cells 10.

The travel motor 53 is a three-phase alternating-current synchronous motor and a drive source for driving wheels. The travel motor 53 has a function serving as a motor to be rotationally driven upon receiving the supply of power from the fuel cell stack 1 and the battery 55 and a function serving as a generator for generating power by being rotationally driven by an external force.

The inverter 54 is composed of a plurality of semiconductor switches such as IGBTs. The semiconductor switches of the inverter 54 are switching-controlled by the controller 6, thereby converting direct-current power into alternating-current power, or alternating-current power into direct-current power. The inverter 54 converts composite direct-current power of output power of the fuel cell stack 1 and output power of the battery 55 into three-phase alternating-current power and supplies this power to the travel motor 53 when the travel motor 53 is caused to function as the motor. In contrast, the inverter 54 converts regenerative power (three-phase alternating-current power) of the travel motor 53 into direct-current power and supplies this power to the battery 55 when the travel motor 53 is caused to function as the generator.

The battery 55 is configured to be charged with a surplus of the output power of the fuel cell stack 1 and the regenerative power of the travel motor 53. The power charged into the battery 55 is supplied to the travel motor 53 and auxiliary machines such as the cathode compressor 25 if necessary.

The DC/DC converter 56 is a bidirectional voltage converter for increasing and decreasing the output voltage of the fuel cell stack 1. By controlling the output voltage of the fuel cell stack 1 by the DC/DC converter 56, the output current of the fuel cell stack 1 and the like are adjusted.

The alternating-current power supply 57 is a power supply for applying an alternating-current voltage to the fuel cell stack 1 for the measurement of an internal impedance of the fuel cell stack 1 to be described later, and parameters such as an amplitude, a phase (particularly angular frequency ω) and the like of the alternating-current voltage are controlled by the controller 6. It should be noted that, as a power supply for internal impedance measurement, an alternating current source for supplying an alternating current to the fuel cell stack 1 may be installed in series with the fuel cell stack 1 instead, of or in addition to, this alternating-current power supply 57. Further, the alternating-current power supply 57 and the alternating current source may be provided in a system different from a path among the terminals 1A, 1B, the inverter 54 and the DC/DC converter.

The controller 6 is configured by a microcomputer including a central processing unit (CPU), a read-only memory (ROM), a random access memory (RAM) and an input/output interface (I/O interface). Sent to the controller 6 are input signals from sensors such as an accelerator stroke sensor (not shown) for detecting a depressed amount of an accelerator pedal besides signals from various sensors such as the current sensor 51 and the voltage sensor 52.

The controller 6 adjusts the pressures and flow rates of the anode gas and the cathode gas to be supplied to the fuel cell stack 1 by controlling the anode pressure control valve 33, the cathode pressure control valve 28, the cathode compressor 25 and the like according to an operating state of the fuel cell system 100.

Further, the controller 6 calculates target output power of the fuel cell stack 1 on the basis of the operating state of the fuel cell system 100. The controller 6 calculates the target output power on the basis of power required by the travel motor 53, power required by the auxiliary machines such as the cathode compressor 25, charge/discharge requests of the battery 55 and the like. The controller 6 calculates a target output current of the fuel cell stack 1 on the basis of the target output power by referring to an IV characteristic (current-voltage characteristic) of the fuel cell stack 1 determined in advance. Then, the controller 6 controls the output voltage of the fuel cell stack 1 by the DC/DC converter 56 such that the output current of the fuel cell stack 1 reaches the target output current, and executes a control to supply a necessary current to the travel motor 53 and the auxiliary machines.

Further, the controller 6 controls the cathode compressor 25 and the like such that a degree of wetness (water content) of each electrolyte membrane 111 of the fuel cell stack 1 is in a state suitable for power generation. The controller 6 has a function of calculating an electrolyte membrane resistance of the fuel cell stack 1 correlated with the degrees of wetness of the electrolyte membranes 111. Further, the controller 6 may have a function of controlling the cathode compressor 25 and the like such that the electrolyte membrane resistance has a predetermined target value determined to set a satisfactory degree of wetness of the electrolyte membranes 111.

Furthermore, in the present embodiment, the controller 6 controls the alternating-current power supply 57 to apply an alternating-current voltage of a predetermined frequency to the fuel cell stack 1 in measuring the internal impedance of the fuel cell stack 1. The controller 6 functions as internal impedance measurement unit configured to measure the internal impedance of the fuel cell stack 1 on the basis of the alternating-current voltage of the predetermined frequency applied in this way, and a value detected by the current sensor 51 and representing the output current of the fuel cell stack 1 in response to the alternating-current voltage.

More specifically, this controller 6 calculates the internal impedance of the fuel cell stack 1 at the predetermined frequency by dividing a value obtained by performing a Fourier transform on the alternating-current voltage value from the alternating-current power supply 57 (i.e. value measured by the voltage sensor 52) and a value obtained by performing a Fourier transform on an output alternating-current voltage value received from the current sensor 51.

Further, the controller 6 functions as hydrogen starvation state determination unit configured to calculate an estimation value of the reaction resistance of the anode electrode 112 of the fuel cell stack 1 on the basis of the value of the measured internal impedance and determining a hydrogen starvation state in the anode electrode 112 on the basis of the calculated estimation value of the reaction resistance. Note that the calculation of the estimation value of the reaction resistance of the anode electrode 112 and the determination of the hydrogen starvation state are described in detail later.

FIGS. 4A to 4D are diagrams schematically showing a path of an alternating current output in response to an alternating-current voltage applied by the alternating-current power supply 57 in an equivalent circuit model of the fuel cell stack 1 according to the present embodiment for each frequency band.

Figure 4A:
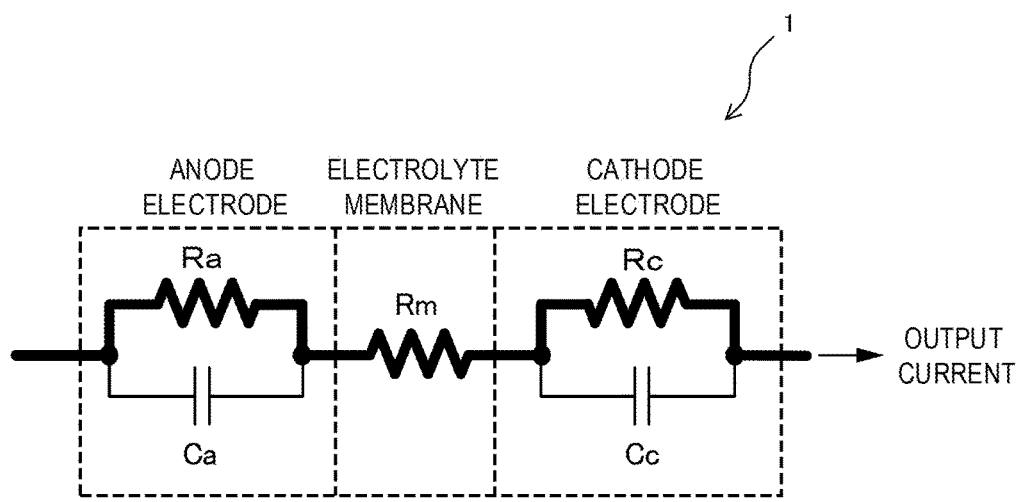
FIG. 4A is a diagram showing a path of a current flowing in a fuel cell equivalent circuit model in the case of applying an alternating-current voltage in a low frequency band.
Figure 4B:
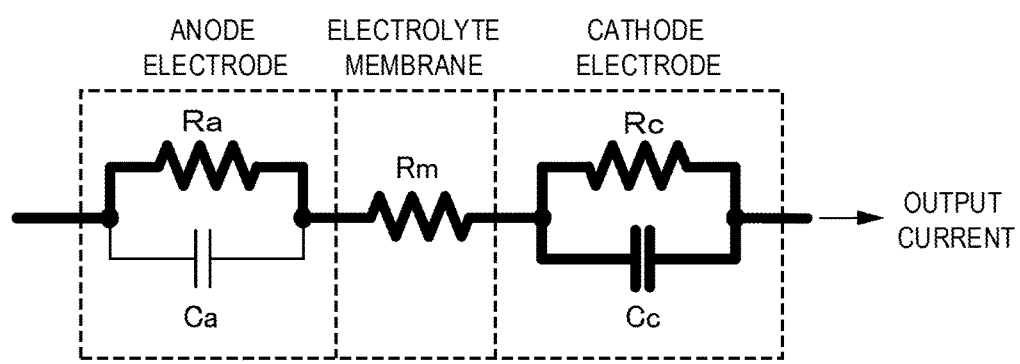
FIG. 4B is a diagram showing a path of a current flowing in the fuel cell equivalent circuit model in the case of applying an alternating-current voltage in a frequency band higher than in the case of FIG. 4A.
Figure 4C:
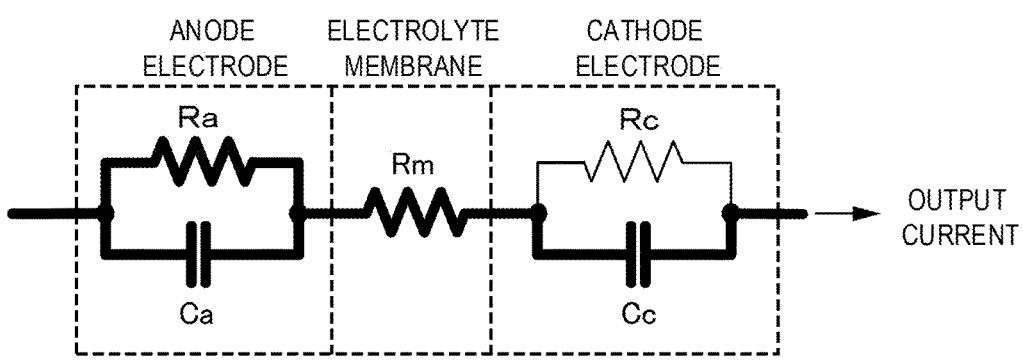
FIG. 4C is a diagram showing a path of a current flowing in the fuel cell equivalent circuit model in the case of applying an alternating-current voltage in a frequency band higher than in the case of FIG. 4B.
Figure 4D:
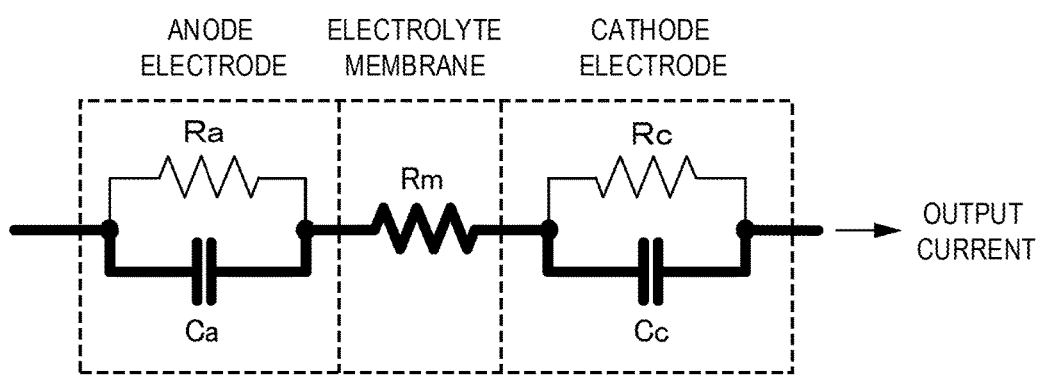
FIG. 4D is a diagram showing a path of a current flowing in the fuel cell equivalent circuit model in the case of inputting an alternating-current voltage in a high frequency band.

Particularly, FIG. 4A shows the path of the output current in the case of applying an alternating-current voltage in a low frequency band, for example, near 0 Hz (hereinafter, written as a first frequency band). FIG. 4B shows the path of the output current in the case of applying an alternating-current voltage in a frequency band slightly higher than the first frequency band by about several Hz (hereinafter, written as a second frequency band). FIG. 4C shows the path of the output current in the case of applying an alternating-current voltage in a frequency band slightly higher than the second frequency band by about several tens of Hz to several KHz (hereinafter, written as a third frequency band). FIG. 4D shows the path of the output current in the case of applying an alternating-current voltage in a highest frequency band of several tens of KHz or higher (hereinafter, written as a fourth frequency band). Note that the path of the output alternating-current is shown by a thick line in FIGS. 4A to 4D.

In these figures, an equivalent circuit of the fuel cell stack 1 in the present embodiment is configured by connecting an electrolyte membrane resistance, which is a resistance component of the electrolyte membrane 111, a reaction resistance and an electrical double layer capacitance of the anode electrode 112 and a reaction resistance and an electrical double layer capacitance of the cathode electrode 113 in series. Here, a value $R_m$ of the electrolyte membrane resistance is determined according to the degree of wetness of the electrolyte membrane 111 of each cell in the fuel cell stack 1. Normally, the value $R_m$ of the electrolyte membrane resistance tends to become higher as the electrolyte membrane 111 becomes drier.

Further, the reaction resistance of the anode electrode 112 is generated due to a reaction of the anode gas in the anode electrode 112 of each cell. If there is a cause due to which this reaction does not smoothly proceed, such as a lack of the anode gas, the estimation value $R_a$ of this reaction resistance increases according to this cause. Furthermore, the electrical double layer capacitance of the anode electrode 112 is modeled to represent a total capacity of the anode electrode 112 of each cell. Thus, a value $C_a$ of the electrical double layer capacitance is determined on the basis of various elements such as a constituting material, the size and the like of the anode electrode 112 of each cell.

Further, the reaction resistance of the cathode electrode 113 is generated due to a reaction of the cathode gas in the cathode electrode 113 of each cell. If there is a cause due to which this reaction does not smoothly proceed such as a lack of the cathode gas, an estimation value $R_c$ of this reaction resistance increases according to this cause. Furthermore, the electrical double layer capacitance of the cathode electrode 113 is modeled to represent a total capacity of the cathode electrode 113 of each cell. Thus, a value $C_c$ of the electrical double layer capacitance is determined on the basis of various elements such as a constituting material, the size and the like of the cathode electrode 113 of each cell.

A reason why the current path changes according to the frequency band of the applied alternating-current voltage as shown in FIGS. 4A to 4D is considered below. First, the alternating-current voltage in the first frequency band shown in FIG. 4A has a low frequency, wherefore a positive/negative variation frequency of the value thereof is low and properties thereof are close to those of a direct current having a constant voltage value. Thus, the output current has properties close to those of the direct current. Therefore, a current hardly flows or only a negligibly small current flows to the electrical double layer capacitance parts of both the anode electrode 112 and the cathode electrode 113.

Next, in the case of applying the alternating-current voltage in the second frequency band shown in FIG. 4B, the positive/negative variation frequency is higher as compared to the above alternating-current voltage in the above first frequency band. Thus, properties as an alternating current are intensified and the alternating current is thought to start flowing also to the electrical double layer capacitance side of the cathode electrode 113. However, the estimation value $R_a$ of the reaction resistance in the anode electrode 112 is generally known to be a very small value as compared to the estimation value $R_c$ of the reaction resistance of the cathode electrode 113. Thus, a current relatively easily flows to the reaction resistance side of the anode electrode 112, wherefore a current is thought not to substantially flow to the electrical double layer capacitance part of the anode electrode 112 yet in the second frequency band.

Further, in the case of the applying the alternating-current voltage in the third frequency band shown in FIG. 4C, the positive/negative variation frequency is higher as compared to the alternating-current voltage in the above second frequency band. Thus, the influence of the electrical double layer capacitance component of the anode electrode 112 cannot be ignored and a current is thought to flow also to the electrical double layer capacitance component of the anode electrode 112. On the other hand, in this third frequency band, a situation occurs in which a switch between a reduction reaction and an oxidation reaction in the cathode electrode 113 cannot keep up with and follow a positive/negative variation speed of the above alternating-current voltage.

Accordingly, the reaction of the cathode gas in the cathode electrode 113 does not substantially occur. Thus, the influence of the reaction resistance of the cathode electrode 113 generated due to the reduction/oxidation reaction of oxygen can be ignored. Specifically, in the third frequency band, an alternating current hardly flows or a very small alternating current flows to the reaction resistance of the cathode electrode 113 and the alternating current is thought to flow substantially only to the electrical double layer capacitance component as shown in FIG. 4C. It should be noted that a switching speed between the oxidation reaction and the reduction reaction in the anode electrode 112 is faster than that between the oxidation reaction and the reduction reaction in the cathode electrode 113 and, hence, can still follow the negative/positive variation speed of the alternating-current voltage and the current flows to the reaction resistance of the anode electrode 112 in the third frequency band.

In the case of applying the alternating-current voltage in the fourth frequency band shown in FIG. 4D, the positive/negative variation frequency is even higher as compared to the alternating-current voltage of the above third frequency band. Thus, a situation occurs in which a switch between the oxidation reaction and the reduction reaction not only in the cathode electrode 113, but also in the anode electrode 112 cannot follow the positive/negative variation speed of the above alternating-current voltage. Therefore, the reactions in the anode electrode 112 do not occur in addition to those in the cathode electrode 113, and the influence of the reaction resistances of both the cathode electrode 113 and the anode electrode 112 can be ignored. Specifically, in this fourth frequency band, no alternating-current current flows or only a very small current flows to the reaction resistances of both the cathode electrode 113 and the anode electrode 112. Thus, the alternating current flows only to the electrical double layer capacitance components of the respective cathode and anode electrodes 113, 112.

From the above considerations, the present inventors arrived at an idea that the influence of the reaction resistance component of the cathode electrode 113 was smaller than the influence of the reaction resistance component of the anode electrode 112 at the internal impedance of the fuel cell stack 1 since substantially no current flowed to the reaction resistance of the cathode electrode 113 and the current flowed to the reaction resistance of the anode electrode 112 as shown in FIG. 4C by applying an alternating-current voltage of a predetermined frequency included in the above third frequency band. Specifically, the influence of the reaction resistance component of the cathode electrode 113 is negligible as compared to the influence of the reaction resistance component of the anode electrode 112.

In both the following first and second embodiments, the estimation value $R_a$ of the reaction resistance of the anode electrode 112 is calculated using an internal impedance Z in the case of applying an alternating-current voltage of a frequency in the third frequency band, and a state of the fuel cell stack 1 is determined on the basis of the calculated estimation value $R_a$ of the reaction resistance in calculating the reaction resistance $R_a$.

Further, it is generally known that there is a relationship of $\omega=2\pi f$ between a "frequency f" and an "angular frequency $\omega$", and there is only a difference multiplied by a dimensionless constant $2\pi$ between these. Thus, the "frequency" and the "angular frequency" are identified with each other and a symbol "$\omega$" is used for brevity in expressing both in the description below.

First Embodiment

Figure 5:
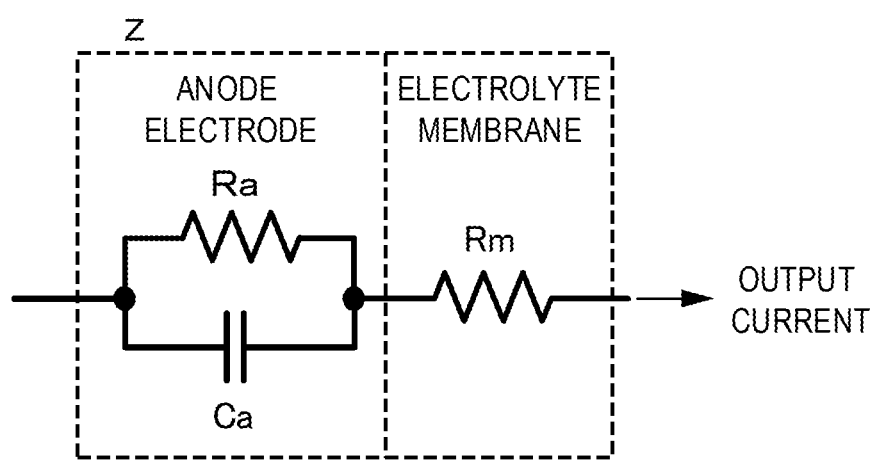
FIG. 5 is a diagram showing an equivalent circuit model of a fuel cell stack employed in a first embodiment.

The first embodiment is described below. In the first embodiment, the value of the reaction resistance $R_a$ is calculated, further assuming that the value $C_c$ of the electrical double layer capacitance of the cathode electrode 113 is relatively small and can be ignored in the case of applying an alternating-current voltage of a predetermined frequency included in the third frequency band. An equivalent circuit model of the fuel cell stack 1 in this case is a model shown in FIG. 5 constituted by a reaction resistance, an electrical double layer capacitance and an electrolyte membrane resistance on an anode electrode side.

Accordingly, an equation based on this equivalent circuit model is expressed as follows.

[Equation 1]

$$Z = R_m + \frac{R_a(1 - j\omega C_a R_a)}{1 + \omega^2 C_a^2 R_a^2} \quad (1)$$

(where Z denotes the internal impedance of the fuel cell stack 1, j denotes an imaginary unit, $\omega$ denotes the angular frequency of the alternating-current voltage (current), $R_m$ denotes the electrolyte membrane resistance, $R_a$ denotes the reaction resistance value of the anode electrode 112 and $C_a$ denotes the electrical double layer capacitance of the anode electrode 112).

The calculation of the estimation value $R_a$ of the reaction resistance using an imaginary component $Z_{im}$ of the internal impedance Z (calculation method 1) and the calculation of the estimation value $R_a$ of the reaction resistance using a real component $Z_{re}$ of the internal impedance Z (calculation method 2) are individually described. It should be noted that, in calculating the estimation value $R_a$ of the reaction resistance, the estimation value $R_a$ may be calculated using either one of the calculation methods 1 and 2 or an average of the calculated values obtained using the both calculation methods 1 and 2 may be set as the estimation value $R_a$.

Calculation Method 1. If only an imaginary component of the internal impedance in the above Equation (1) is taken out and changed for the calculation of the estimation value $R_a$ of the reaction resistance using the imaginary component $Z_{im}$ of the internal impedance, the following equation is obtained.

[Equation 2]

$$-\frac{1}{\omega Z_{im}} = \frac{1}{\omega^2 C_a R_a^2} + C_a \quad (2)$$

Figure 6:
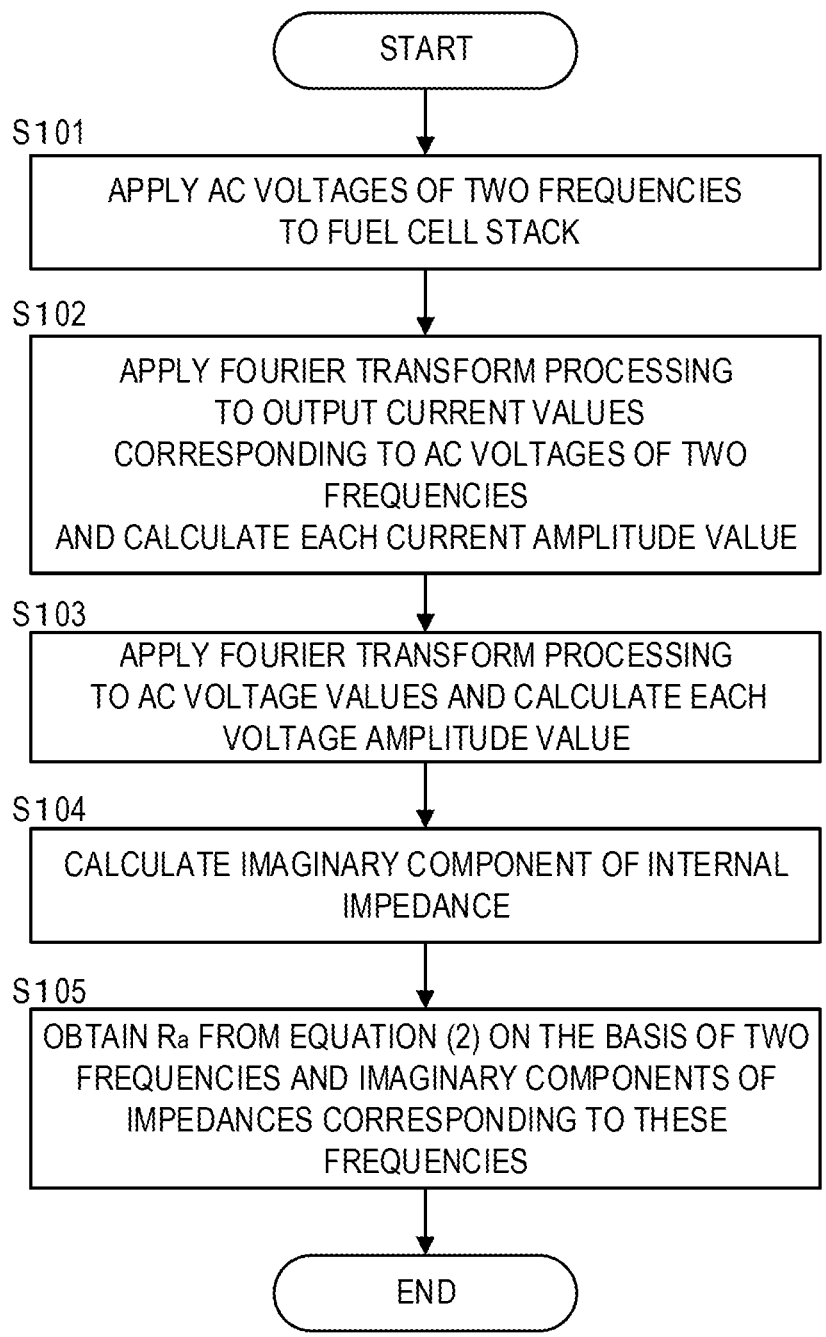
FIG. 6 is a flow chart showing the process of calculating a reaction resistance $R_a$ of an anode electrode using an imaginary component of an internal impedance.

FIG. 6 is a flow chart showing the process of calculating the estimation value $R_a$ of the reaction resistance using the imaginary component $Z_{im}$ of the internal impedance. Here, Steps S101 to S104 described below constitute an internal impedance measurement step, and Step S105 constitutes a reaction resistance estimation/calculation step.

As shown, the controller 6 first causes the alternating-current power supply 57 to apply alternating-current voltages $V_{in1}$ and $V_{in2}$ of two different frequencies $\omega_1$ and $\omega_2$ included in the above third frequency band to the fuel cell stack 1 at an internal impedance measurement timing in Step S101.

In Step S102, the controller 6 performs a Fourier transform processing on current values $I_{out1}$ and $I_{out2}$ of output currents respectively corresponding to the alternating-current voltages $V_{in1}$ and $V_{in2}$ and measured by the current sensor 51 to calculate current amplitude values $I_{out}(\omega_1)$ and $I_{out}(\omega_2)$.

In Step S103, the controller 6 performs a Fourier transform processing on the alternating-current voltages $V_{in1}$ and $V_{in2}$ of the frequencies $\omega_1$ and $\omega_2$ to calculate voltage amplitude values $V_{out}(\omega_1)$ and $V_{out}(\omega_2)$.

In Step S104, internal impedances $Z_1$, $Z_2$ are calculated by dividing the above voltage amplitude values $V_{out}(\omega_1)$ and $V_{out}(\omega_2)$ by the current amplitude values $I_{out}(\omega_1)$ and $I_{out}(\omega_2)$ for the respective frequencies $\omega_1$ and $\omega_2$, and imaginary components $Z_{im1}$ and $Z_{im2}$ of the internal impedances are calculated by taking imaginary components of these internal impedances.

In Step S105, the frequencies $\omega_1$ and $\omega_2$ and the calculated imaginary components $Z_{im1}$ and $Z_{im2}$ of the internal impedances are substituted into the above Equation (2), whereby an equation with $C_a$ and $R_a$ serving as unknowns is obtained and solved. Particularly, if two points at two frequencies $\omega_1$ and $\omega_2$ are plotted on a coordinate system with $(-1/\omega Z_{im})$ represented on a vertical axis and $(1/\omega^2)$ represented on a horizontal axis for the above Equation (2), a straight line is drawn and a gradient and an intercept of this straight line are obtained, this gradient becomes equal to $(1/(C_a \cdot R_a^2))$ and the intercept becomes equal to $(C_a)$. Thus, the estimation value $R_a$ of the reaction resistance can be easily calculated.

Subsequently, it is described that the estimation value $R_a$ of the reaction resistance of the anode electrode 112 calculated on the basis of the two frequencies $\omega_1$ and $\omega_2$ in the third frequency band as described above is highly accurately correlated with a level of a hydrogen concentration involved in the reaction in the anode electrode 112. It should be noted that specific numerical values shown below are examples for the purpose of clarifying functions and effects by a state determination of a fuel cell according to the present embodiment and not intended to limit the technical scope of the present invention to these numerical values.

Figure 7A:
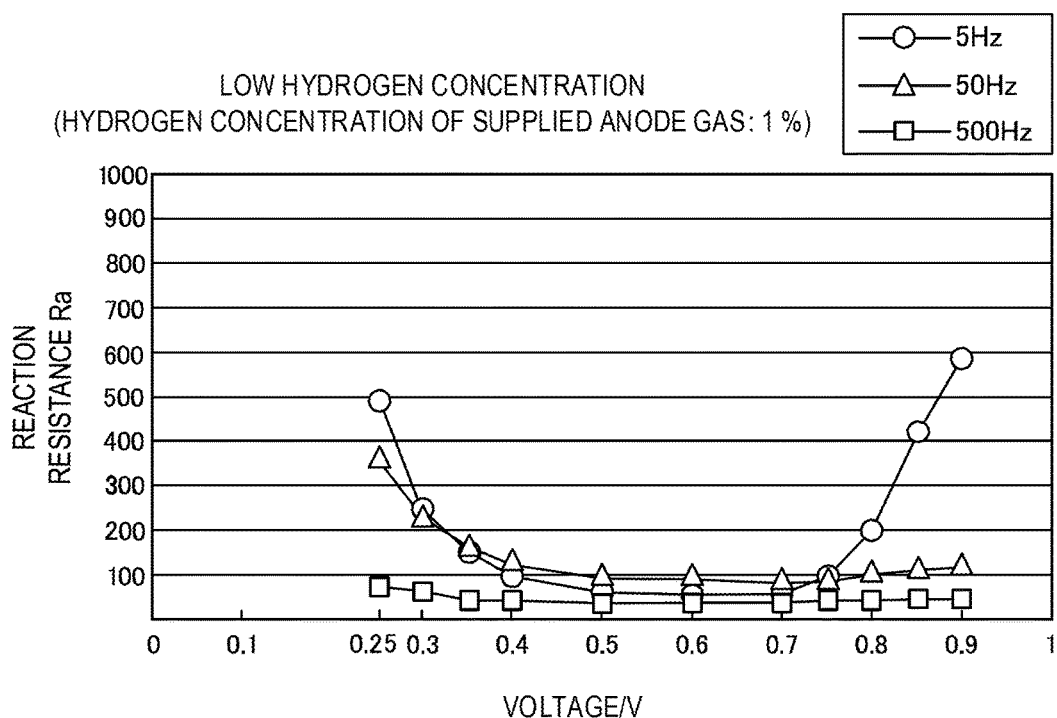
FIG. 7A is a graph showing a relationship between the calculated estimation value $R_a$ of the reaction resistance of the anode electrode and a concentration of hydrogen involved in a reaction in the anode electrode.

First, FIG. 7A is a graph showing a relationship with the estimation value $R_a$ of the reaction resistance of the anode electrode in each of cases where the frequencies $\omega_1$ and $\omega_2$ to be selected for the aforementioned calculation of the estimation value $R_a$ of the reaction resistance are selected from a frequency band near 5 Hz, selected from a frequency band near 50 Hz and selected from a frequency band near 500 Hz when a low hydrogen concentration state (hydrogen concentration of the supplied anode gas is 1%) of the fuel cell is assumed.

In FIG. 7A, a horizontal axis of the graph represents a cell voltage (maximum of 1 V) of one fuel cell. Here, the cell voltage is reduced from 1 V toward a left side of the horizontal axis. This reduction of the cell voltage is induced by a reduction of the hydrogen concentration of the anode gas actually involved in the reaction in the catalyst layer 112A below 1%. Specifically, in such a situation where hydrogen starvation, in which the hydrogen concentration of the supplied anode gas is 1%, is likely to occur, the cell voltage has a lower value as the hydrogen concentration of the anode gas involved in the reaction decreases. On the other hand, an oxygen concentration of the cathode gas supplied to each cathode electrode 113 is 21%. Thus, it may be assumed that the oxygen concentration is sufficient and oxygen starvation does not occur.

As is understood by referring to a line graph of circular plot points of FIG. 7A, an increase of the estimation value $R_a$ of the reaction resistance is seen in a cell voltage range of about 0.75 to 0.9 V at which the hydrogen concentration of the anode gas involved in the reaction is thought to be relatively high in addition to a cell voltage range of about 0.25 to 0.4 V at which the hydrogen concentration of the anode gas involved in the reaction is thought to be relatively low (hydrogen starvation state) in the case of selecting the above frequencies near 5 Hz.

On the other hand, no increase of the estimation value $R_a$ of the reaction resistance is seen in a cell voltage range of about 0.4 V to 0.75 V at which the hydrogen concentration of the anode gas involved in the reaction is thought to be in an intermediate quantity. Thus, in the case of applying the alternating-current voltages of the two frequencies selected from the frequency band near 5 Hz, an increase of the estimation value $R_a$ of the reaction resistance is seen in the cell voltage range of 0.25 to 0.4 V, but an increase of the estimation value $R_a$ of the reaction resistance is also seen in the cell voltage range of 0.75 to 0.9 V. Thus, the estimation value $R_a$ of the reaction resistance is increased by a factor other than an improvement of the hydrogen concentration. Therefore, this frequency band is thought to be unpreferable to be selected as the third frequency band.

Further, as is understood by referring to a line graph of square plot points of FIG. 7A, almost no variation of the estimation value $R_a$ of the reaction resistance is seen regardless of the magnitude of the hydrogen concentration of the anode gas involved in the reaction, i.e. the magnitude of the cell voltage in the case of selecting the frequencies near 500 Hz. Thus, it is understood that, in the case of applying alternating-current voltages of two frequencies near 500 Hz, the influence of a reduction of the hydrogen concentration does not appear in the variation of the estimation value $R_a$ of the reaction resistance. Therefore, this frequency band is thought to be unpreferable to be selected as the third frequency band.

Furthermore, as is understood by referring to a line graph of triangular plot points of FIG. 7A, an increase of the estimation value $R_a$ of the reaction resistance is seen in the cell voltage range of about 0.25 to 0.4 V at which the hydrogen concentration of the anode gas involved in the reaction is thought to be low in the case of selecting the frequencies near 50 Hz. However, no increase of the estimation value $R_a$ of the reaction resistance is seen in the cell voltage range of about 0.4 V to 0.75 V and in the cell voltage range of 0.75 V to 0.9 V at which the hydrogen concentration of the anode gas involved in the reaction is not less than an intermediate quantity.

Accordingly, in the case of applying the alternating-current voltages of the two frequencies near 50 Hz, the level of the hydrogen concentration involved in the reaction is linked to an increase of the estimation value $R_a$ of the reaction resistance. Specifically, since the calculated estimation value $R_a$ of the reaction resistance is well correlated with the level of the hydrogen concentration involved in the reaction without depending on other factors, it is most preferable to select frequencies near 50 Hz as the third frequency band as compared to the case of selecting frequencies near 5 Hz and near 500 Hz.

Figure 7B:
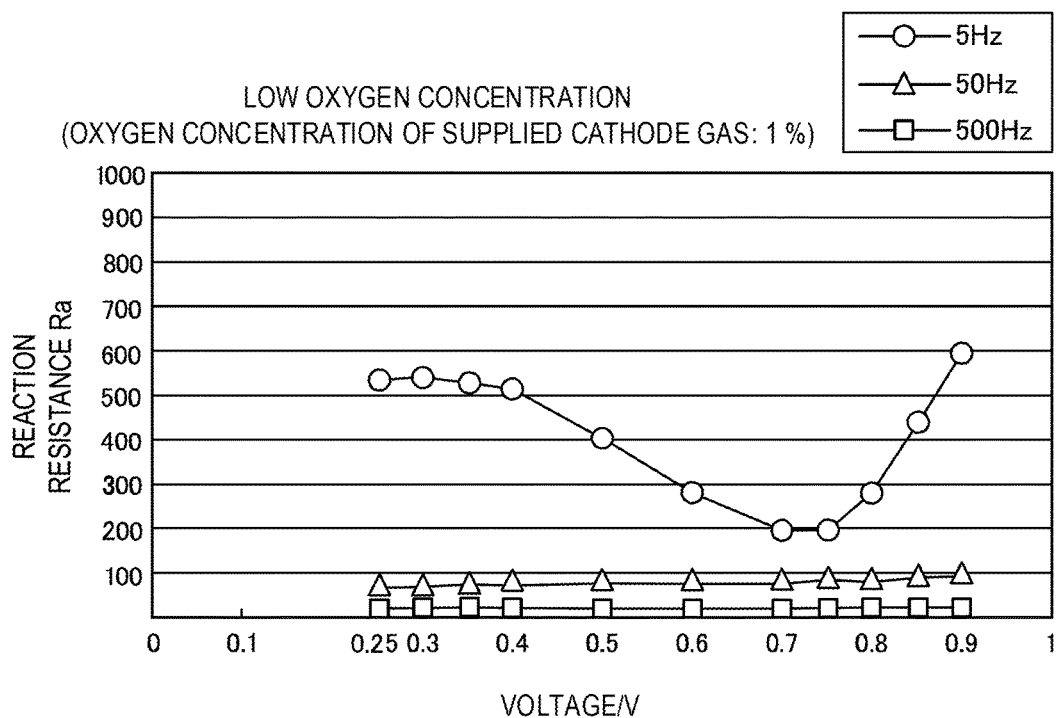
FIG. 7B is a graph showing a relationship between the calculated estimation value $R_a$ of the reaction resistance of the anode electrode and a concentration of oxygen involved in a reaction in a cathode electrode.

Next, FIG. 7B is a graph showing a relationship with the estimation value $R_a$ of the reaction resistance of the anode electrode 112 in each of cases where the frequencies $\omega_1$ and $\omega_2$ to be selected for the aforementioned calculation of the estimation value $R_a$ of the reaction resistance are selected from a frequency band near 5 Hz, selected from a frequency band near 50 Hz and selected from a frequency band near 500 Hz when a low oxygen concentration state (oxygen concentration of the supplied cathode gas is 1%) of the cell is assumed.

In FIG. 7B, a case where the oxygen concentration of the cathode gas supplied to each cathode electrode 113 is 1% is assumed as the low oxygen concentration state of the cell, and a horizontal axis of the graph represents a cell voltage (maximum of 1 V) of one fuel cell.

Here, the cell voltage is reduced from 1 V toward a left side of the horizontal axis. This reduction of the cell voltage is induced by a reduction of the oxygen concentration of the cathode gas involved in the reaction in the catalyst layer 113A below 1%. Specifically, the cell voltage has a lower value (value on the left side of the horizontal axis) as the oxygen concentration of the cathode gas involved in the reaction decreases. It should be noted that the hydrogen concentration of the anode gas supplied to each anode electrode 112 is 100%, wherefore it may be assumed that the hydrogen starvation state is not reached.

As is understood by referring to a line graph of circular plot points of FIG. 7B, an increase of the estimation value $R_a$ of the reaction resistance is seen outside a cell voltage range of about 0.7 V to 0.75 V at which the oxygen concentration of the cathode gas involved in the reaction is thought to be in an intermediate quantity in the case of selecting the frequencies near 5 Hz. Specifically, the estimation value $R_a$ of the reaction resistance varies according to the oxygen concentration of the cathode gas involved in the reaction in the case of applying alternating-current voltages of two frequencies near 5 Hz.

Further, as is understood by referring to line graphs of square and triangular plot points of FIG. 7B, the estimation value $R_a$ of the reaction resistance does not vary regardless of the magnitude of the cell voltage on the horizontal axis in the case of selecting frequencies near 500 Hz and frequencies near 50 Hz. Specifically, at these frequencies, the calculated estimation value $R_a$ of the reaction resistance is thought not to be influenced by the oxygen concentration of the cathode gas involved in the reaction.

Thus, in the case of selecting the frequencies $\omega_1$ and $\omega_2$ from the frequency band near 50 Hz, not only the correlation between the above calculated estimation value $R_a$ of the reaction resistance and the hydrogen starvation state, but also no correlation with the level of the oxygen concentration involved in the reaction were clearly indicated and it was found that the frequency band near 50 Hz was preferable as the third frequency band.

Figure 8A:
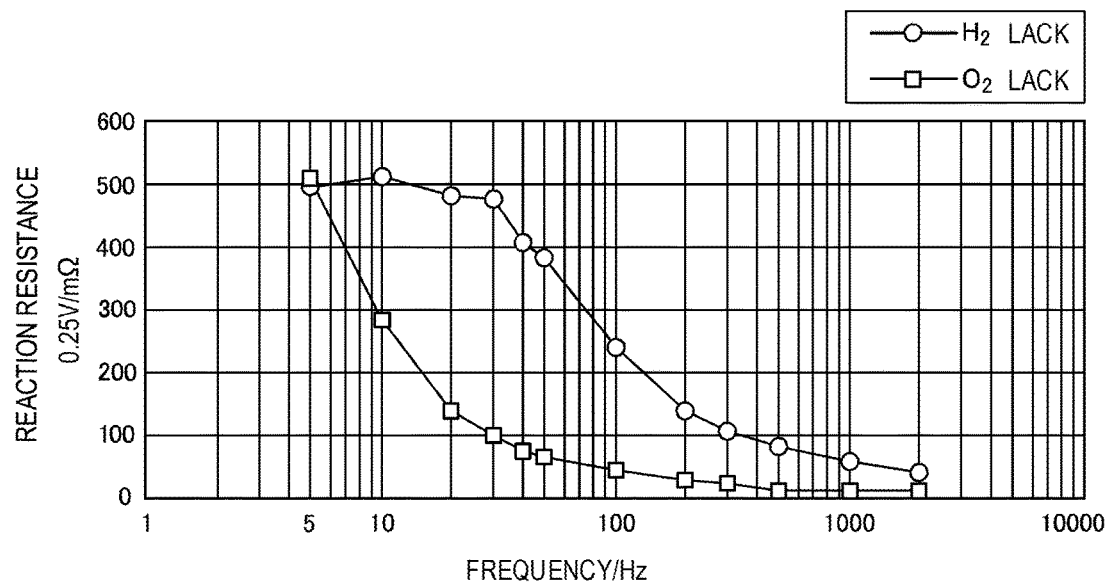
FIG. 8A is a graph showing the estimation value $R_a$ of the reaction resistance during hydrogen starvation and the estimation value $R_a$ of the reaction resistance during oxygen starvation in the case of selecting a frequency from each frequency band.

Next, FIG. 8A shows the estimation value $R_a$ of the reaction resistance calculated under the above hydrogen starvation state and the estimation value $R_a$ of the reaction resistance calculated under the above oxygen starvation state in a frequency range of 5 Hz to 2000 Hz. Further, FIG. 8B is a graph showing a difference between the estimation value $R_a$ of the reaction resistance calculated under the above hydrogen starvation state and the estimation value $R_a$ of the reaction resistance calculated under the above oxygen starvation state in FIG. 8A.

Figure 8B:
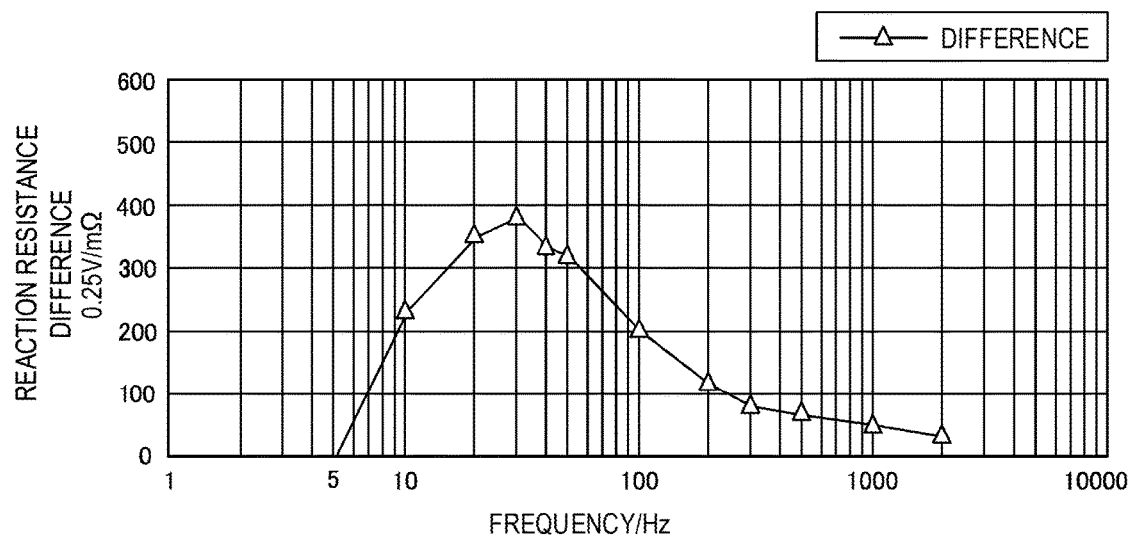
FIG. 8B is a graph showing the value of a difference between the reaction resistances during hydrogen starvation and during oxygen starvation in FIG. 8A.

Here, in FIGS. 8A and 8B, a state where the cell voltage is about 0.25 V or lower in the above low hydrogen concentration state (hydrogen concentration of the supplied anode gas is 1%) is particularly assumed as the "hydrogen starvation". Further, a state where the cell voltage is about 0.25 V or lower in the above low oxygen concentration state (oxygen concentration of the supplied anode gas is 1%) is particularly assumed as the "oxygen starvation".

In FIG. 8A, a plurality of (12 in the graph) frequencies are selected in the frequency range of 5 Hz to 2000 Hz in the hydrogen starvation state, the above frequencies $\omega_1$ and $\omega_2$ are selected from the vicinities of these selected frequencies, and the estimation value $R_a$ of the reaction resistance is calculated using these frequencies $\omega_1$ and $\omega_2$. Thus, in this graph, the estimation value $R_a$ of the reaction resistance during the hydrogen starvation is shown by a circular plot point for each of the plurality of frequencies selected as frequencies on a horizontal axis.

Further, similarly, a plurality of (12 in the graph) frequencies are selected in the frequency range of 5 Hz to 2000 Hz in the oxygen starvation state, the above frequencies $\omega_1$ and $\omega_2$ are selected from the vicinities of these selected frequencies, and the estimation value $R_a$ of the reaction resistance is calculated using these frequencies $\omega_1$ and $\omega_2$. Thus, in this graph, the estimation value $R_a$ of the reaction resistance during the oxygen starvation is shown by a rectangular plot point for each of the plurality of frequencies selected as frequencies on the horizontal axis.

As is understood from each figure, there is a difference of a predetermined value or larger between the estimation value $R_a$ of the reaction resistance calculated during the hydrogen starvation, and the estimation value $R_a$ of the reaction resistance calculated during the oxygen starvation.

As a reason for this, the present inventors think that switch responsiveness between the oxidation reaction and the reduction reaction in the anode electrode 112 to the positive/negative variation of the alternating-current voltage is higher than switch responsiveness between the oxidation reaction and the reduction reaction in the cathode electrode 113 to the positive/negative variation of the alternating-current voltage, whereby the influence of the reaction resistance of the cathode electrode 113 is smaller than that of the reaction resistance of the anode electrode 112. Specifically, the aforementioned third frequency band can be selected in this frequency range.

Particularly, a frequency range of 10 Hz to 100 Hz, more preferably a frequency range of 20 to 50 H is selected as the third frequency band. Particularly, it is most preferable to select a frequency range near 30 Hz as the third frequency band. In this way, the influence of the reaction resistance of the cathode electrode 113 (i.e. influence corresponding to the level of the hydrogen concentration involved in the reaction) is thought to be very small as compared to an actual reaction resistance value of the anode electrode 112. Even if this influence is ignored, accuracy as the equivalent circuit model can be sufficiently maintained.

Specifically, as is clear with reference to FIG. 8B, the difference between the estimation value $R_a$ of the reaction resistance calculated during the hydrogen starvation, and the estimation value $R_a$ of the reaction resistance calculated during the oxygen starvation is 200 Hz or larger in the frequency range of 10 to 100 Hz. Further, the difference between the estimation value $R_a$ of the reaction resistance calculated during the hydrogen starvation and the estimation value $R_a$ of the reaction resistance calculated during the oxygen starvation is 300 Hz or larger in the frequency range of 20 to 50 Hz. Furthermore, the difference between the estimation value $R_a$ of the reaction resistance calculated during the hydrogen starvation and the estimation value $R_a$ of the reaction resistance calculated during the oxygen starvation is 400 Hz or larger in the frequency range near 30 Hz.

calculation method 2. If only the real component of the internal impedance in the above Equation (1) is taken out and changed for the calculation of the estimation value $R_a$ of the reaction resistance using the real component $Z_{re}$ of the internal impedance, the following equation is obtained.

[Equation 3]

$$\frac{1}{Z_{re} - R_m} = \omega^2 C_a^2 R_a + \frac{1}{R_a} \quad (3)$$

Figure 9:
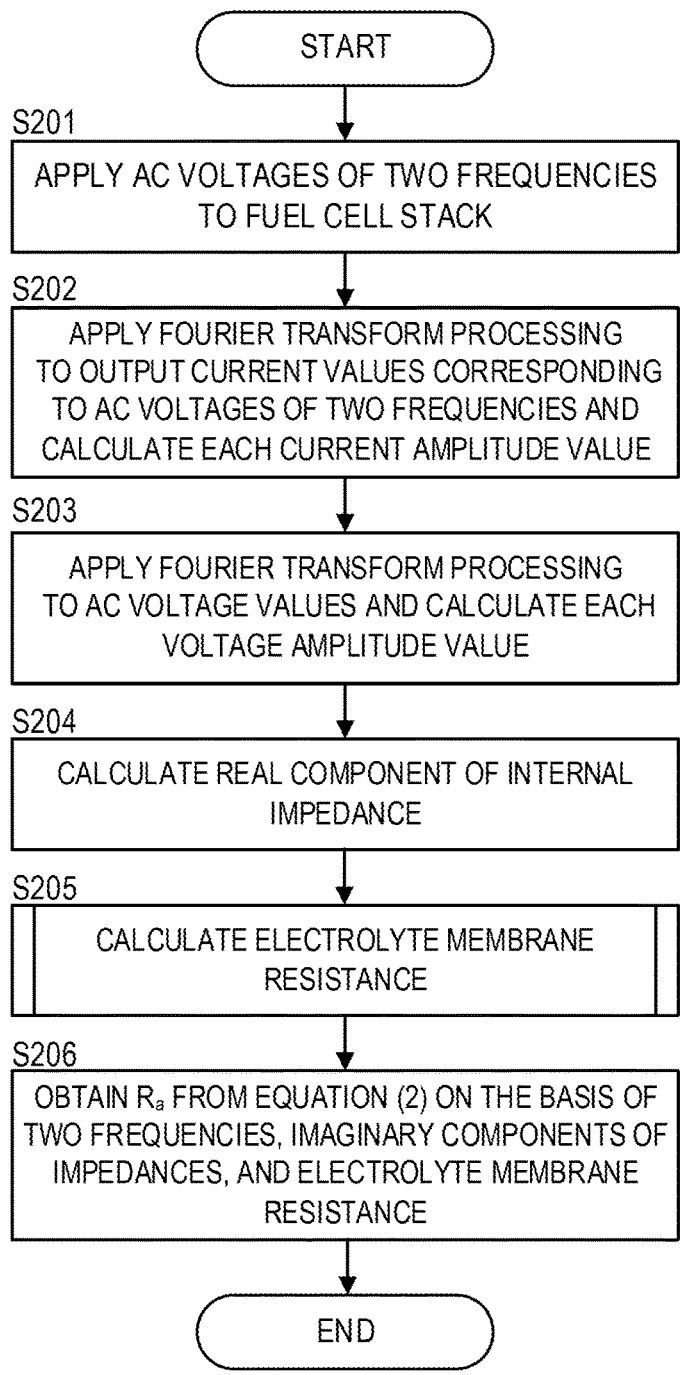
FIG. 9 is a flow chart showing the process of calculating a reaction resistance using a real component of the internal impedance.

FIG. 9 is a flow chart showing the process of calculating the reaction resistance $R_a$ using the real component $Z_{re}$ of the internal impedance.

In Step S201, the controller 6 causes the alternating-current power supply 57 to apply alternating-current voltages $V_{in1}$ and $V_{in2}$ of two different frequencies $\omega_1$ and $\omega_2$ included in the above third frequency band to the fuel cell stack 1 at an internal impedance measurement timing.

In Step S202, the controller 6 performs a Fourier transform processing on current values $I_{out1}$ and $I_{out2}$ of output currents respectively corresponding to the alternating-current voltages $V_{in1}$ and $V_{in2}$ and measured by the current sensor 51 to calculate current amplitude values $I_{out}(\omega_1)$ and $I_{out}(\omega_2)$.

In Step S203, the controller 6 performs a Fourier transform processing on each of the alternating-current voltages $V_{in1}$ and $V_{in2}$ of the frequencies $\omega_1$ and $\omega_2$ to calculate voltage amplitude values $V_{out}(\omega_1)$ and $V_{out}(\omega_2)$.

In Step S204, internal impedances $Z_1$, $Z_2$ are calculated by dividing the above voltage amplitude values $V_{out}(\omega_1)$ and $V_{out}(\omega_2)$ by the current amplitude values $I_{out}(\omega_1)$ and $I_{out}(\omega_2)$ for the respective frequencies $\omega_1$ and $\omega_2$, and real components $Z_{re1}$ and $Z_{re2}$ of the internal impedances are calculated by taking the real components of these.

Since the anode electrical double layer capacitance $C_a$, the anode reaction resistance $R_a$ and the electrolyte membrane resistance $R_m$ are unknown in the above Equation (3), the electrolyte membrane resistance $R_m$ needs to be obtained in addition to the two frequencies $\omega_1$ and $\omega_2$ and the real components $Z_{re}$ ($Z_{re1}$ and $Z_{re2}$, respectively) of the internal impedances corresponding to these frequencies in order to obtain the anode reaction resistance $R_a$. Thus, in Step S205, the electrolyte membrane resistance $R_m$ is obtained.

Figure 10:
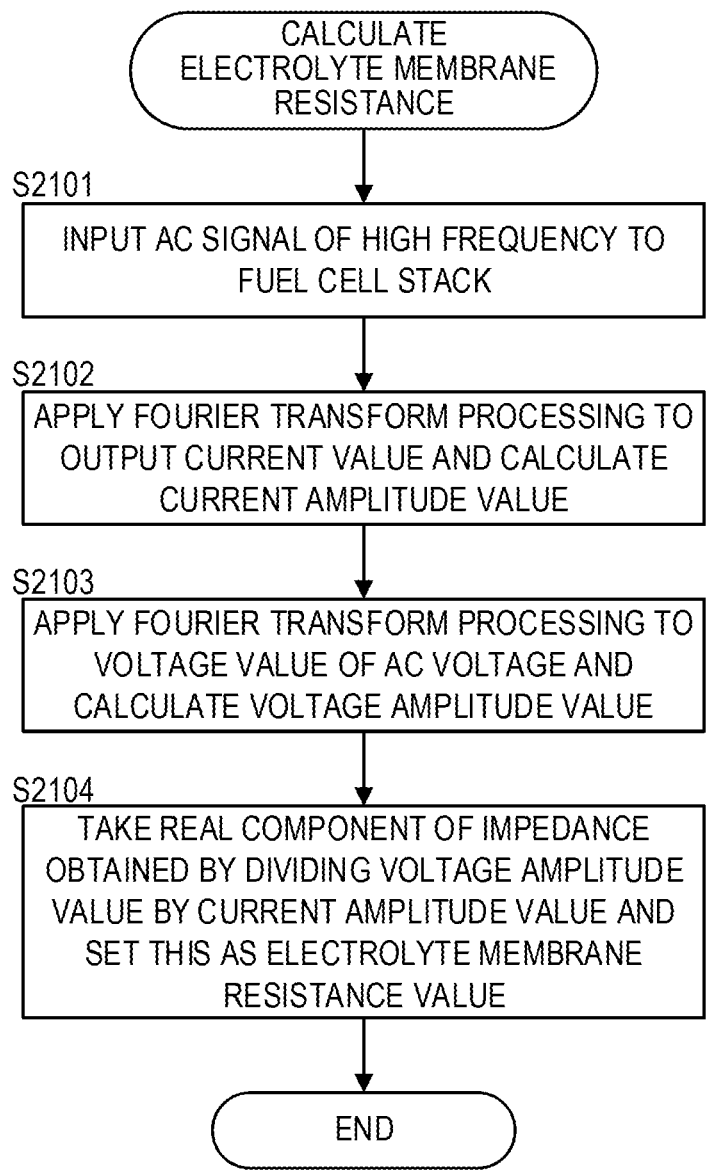
FIG. 10 is a flow chart showing the process of calculating an electrolyte membrane resistance.

FIG. 10 is a flow chart showing the flow of measuring the electrolyte membrane resistance $R_m$ (this measurement is also written as an HFR measurement below). It should be noted that this HFR measurement may be conducted along with the above internal impedance measurement, but it is assumed in the present embodiment that the HFR measurement is separately conducted in advance for the reason of confirming the degree of wetness of the electrolyte membrane or the like.

In Step S2101, the controller 6 causes the alternating-current power supply 57 to apply an alternating-current voltage $V_{in}$ of a high frequency $\omega_\infty$ (several kHz to several tens of kHz) to the fuel cell stack 1 at an internal impedance measurement timing.

In Step S2102, the controller 6 performs a Fourier transform processing on a current value $I_{out}$ of an output current corresponding to the above alternating-current voltage $V_{in}$ and measured by the current sensor 51 and calculates a current amplitude value $I_{out}(\omega_\infty)$.

In Step S2103, the controller 6 performs a Fourier transform processing on the alternating-current voltage $V_{in}$ and calculates a voltage amplitude value $V_{out}(\omega_\infty)$.

In Step S2104, the internal impedance Z is calculated by dividing the above voltage amplitude value $V_{out}(\omega_\infty)$ by the current amplitude value $I_{out}(\omega_\infty)$ and a real component thereof is set as the electrolyte membrane resistance $R_m$ of the fuel cell stack 1.

It should be noted that $\omega \to \infty$ is assumed and the value of the second term on the right side of Equation (1) can be approximated substantially to 0 if the frequency has a sufficiently large value in the order of several kHz or higher at the internal impedance of the fuel cell stack 1 expressed by Equation (1) of the above equivalent circuit model. Thus, if the frequency is in the order of several tens of kHz or higher, the real component $Z_{re}$ of the internal impedance Z substantially matches the value $R_m$ of the electrolyte membrane resistance, wherefore the highly accurate value $R_m$ of the electrolyte membrane resistance can be obtained by this HFR measurement.

Referring back to FIG. 9, in Step S206, the frequencies $\omega_1$ and $\omega_2$ and the calculated real components $Z_{re1}$ and $Z_{re2}$ of the internal impedances and the calculated electrolyte membrane resistance $R_m$ are substituted into the above Equation (3), whereby an equation with $C_a$ and $R_a$ serving as unknowns is obtained and solved. Particularly, if two points at two frequencies $\omega_1$ and $\omega_2$ are plotted on a coordinate system with $(1/(Z_{re}-R_m))$ represented on a vertical axis and $\omega^2$ represented on a horizontal axis, a straight line is drawn and a gradient and an intercept of this straight line are obtained, this gradient becomes equal to $C_a^2 \cdot R_a$ and the intercept becomes equal to $1/R_a$. Thus, the estimation value $R_a$ of the reaction resistance can be easily calculated.

It should be noted that, as a method for obtaining the above electrolyte membrane resistance $R_m$, the real components $Z_{re}$ of the internal impedances may be measured at three frequencies $\omega_1$, $\omega_2$ and $\omega_3$, and these frequencies $\omega_1$, $\omega_2$ and $\omega_3$ and the measurement values of $Z_{re}$ may be substituted into Equation (3) and an obtained equation with $C_a$, $R_a$ and $R_m$ serving as unknowns may be solved instead of the HFR measurement in Steps S2101 to S2104. In this way, the estimation value $R_a$ can be calculated without conducting the HFR measurement.

As described above, using the calculated estimation value $R_a$ of the reaction resistance of the anode electrode 112, the controller 6 determines whether or not there is hydrogen starvation in the anode electrode 112 on the basis of whether or not the reaction resistance $R_a$ is larger than a predetermined value (hydrogen starvation state determination step).

Specifically, if the estimation value $R_a$ of the reaction resistance of the anode electrode 112 is higher than a predetermined threshold value determined in advance, the occurrence of the hydrogen starvation in the anode electrode 112 is determined. On the other hand, if the estimation value $R_a$ of the reaction resistance of the anode electrode 112 is not higher than the above threshold value, the absence of the hydrogen starvation state is determined.

Here, if the hydrogen starvation is left unsolved, an exothermic reaction to corrode carbon serving as a catalyst carrier proceeds in the anode electrode 112 and the electrode may be broken by generated heat. Further, a voltage loss may be generated in the anode electrode 112 due to this reaction to corrode carbon. If the fuel cell continues to be further used in this state, a large potential difference is generated between the both electrodes, which may lead to the breakage of the electrodes. Thus, if the hydrogen starvation state is determined, it is important for the controller 6 to execute a control to quickly stop power generation by the fuel cell stack 1.

Figure 11:
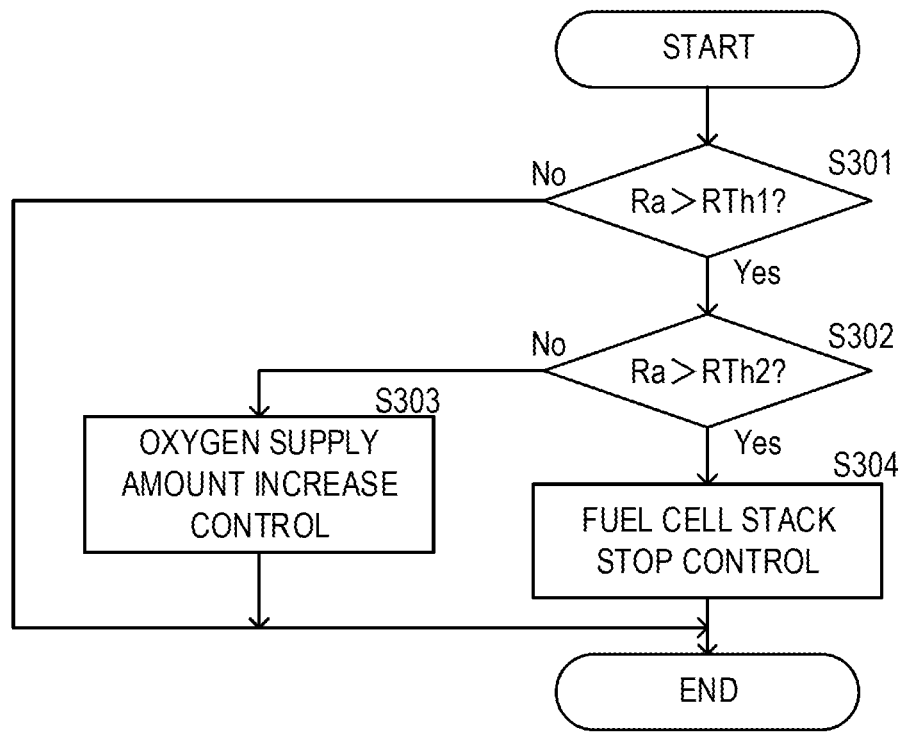
FIG. 11 is a flow chart showing a hydrogen starvation determination, and an example of a control mode of the fuel cell system based on the hydrogen starvation determination.

Next, an example in which the hydrogen starvation determination and the control mode of the fuel cell system 100 based on the hydrogen starvation determination are further improved is described. FIG. 11 is a flow chart showing modifications of the hydrogen starvation determination and the control mode of the fuel cell system 100 based on the hydrogen starvation determination.

In Step S301, the controller 6 determines whether or not the calculated estimation value $R_a$ of the reaction resistance of the anode is larger than a first hydrogen starvation determination threshold value $R_{TH1}$. If it is determined that the calculated estimation value $R_a$ of the reaction resistance is not larger than the first hydrogen starvation determination threshold value $R_{TH1}$, it is judged that hydrogen is sufficiently present and the process is finished to return to a normal control. On the other hand, an advancement is made to Step S302 if the estimation value $R_a$ is larger than the first hydrogen starvation determination threshold value $R_{TH1}$.

In Step S302, the controller 6 determines whether or not the calculated estimation value $R_a$ of the reaction resistance of the anode is larger than a second hydrogen starvation determination threshold value $R_{TH2}$. If it is determined that the calculated estimation value $R_a$ of the reaction resistance is not larger than the second hydrogen starvation determination threshold value $R_{TH2}$, an advancement is made to Step S303. In Step S303, the controller 6 executes a control to increase a hydrogen supply amount.

On the other hand, if it is determined in Step S302 that the estimation value $R_a$ of the reaction resistance is larger than the second hydrogen starvation determination threshold value $R_{TH2}$, an advancement is made to Step S304, and the controller 6 executes a control to stop the operation of the fuel cell stack 1. Specifically, power generation is stopped. It should be noted that the aforementioned first hydrogen starvation determination threshold value $R_{TH1}$ and second hydrogen starvation determination threshold value $R_{TH2}$ are constants appropriately determined in consideration of various elements such as the specifications of the fuel cell stack 1 and the number of laminations of the cells. Further, whether or not there are any safety problems is judged according to how much the estimation value $R_a$ of the reaction resistance exceeds the second hydrogen starvation determination threshold value $R_{TH2}$, i.e. the magnitude of the value $R_a - R_{TH2}$. If the absence of the safety problem is judged, power generation may be partly limited by reducing the magnitude of the output current instead of stopping power generation.

According to the controller 6 (state determination device) provided in the fuel cell system 100 of the present embodiment, the following effects can be obtained.

The controller 6 functions as internal impedance measurement unit configured to measure the internal impedance Z of the fuel cell stack 1 on the basis of alternating-current signals ($I_{out1}$, $I_{out2}$) of predetermined frequencies ($\omega_1$, $\omega_2$) output from the fuel cell stack 1. Further, the controller 6 functions as anode reaction resistance estimation/calculation unit configured to calculate the estimation value $R_a$ of the reaction resistance of the anode electrode 112 of the fuel cell stack 1 on the basis of the measured internal impedance Z. Here, the predetermined frequency is a frequency selected such that the difference between the estimation value $R_a$ of the reaction resistance of the anode electrode 112 during the hydrogen starvation and the estimation value $R_a$ of the reaction resistance of the anode electrode 112 during the oxygen starvation is not smaller than a predetermined value.

There is not necessarily any restriction on a specific theory, but the present inventors think that the influence of the reaction resistance component of the cathode electrode 113 is smaller than that of the reaction resistance component of the anode electrode 112 since, at such a frequency, a response speed of the switch between the reduction reaction and the oxidation reaction in the cathode electrode 113 to the positive/negative variation speed of the alternating-current signal, is faster than a response speed of the switch between the reduction reaction and the oxidation reaction in the anode electrode 112 to the positive/negative variation speed of this alternating-current signal. Particularly, at the above predetermined frequency, a current flowing to the reaction resistance of the cathode electrode 113 in response to the applied alternating-current voltage $V_{in}$ is substantially zero.

Specifically, the reaction resistance of the cathode electrode 113 can be ignored in the equivalent circuit.

Accordingly, the estimation value $R_a$ of the reaction resistance of the anode electrode 112 independent of the state of the cathode electrode 113 can be obtained from the internal impedance Z of the fuel cell stack 1 and the hydrogen starvation state of the anode electrode 112 can be determined on the basis of this estimation value, with the result that the hydrogen starvation state can be determined with high reliability as shown in FIG. 7A.

Particularly, as is understood with reference to FIG. 7B and the like, the estimation value $R_a$ of the reaction resistance of the anode electrode 112 at the internal impedance Z is substantially not correlated with a change of the oxygen concentration of the cathode gas involved in the reaction in the cathode electrode 113 at the above predetermined frequency. In this way, the estimation value $R_a$ of the reaction resistance of the anode electrode 112 more strongly correlated with the level of the hydrogen concentration of the anode gas involved in the reaction in the anode electrode 112 can be obtained, with the result that the reliability of the hydrogen starvation state determination is further improved.

Further, the above predetermined frequency is selected from the frequency range of 10 Hz to 100 Hz. Preferably, the predetermined frequency is selected from the frequency range of 20 Hz to 50 Hz. Particularly preferably, the predetermined frequency is selected from the frequency range near 30 Hz.

As just described, if the above frequency is selected from the frequency range of 10 Hz to 100 Hz, the aforementioned difference between the reaction resistance $R_a$ during the hydrogen starvation and the reaction resistance $R_a$ during the oxygen starvation is 200 mΩ or larger. Since the influence of an abnormality in the cathode electrode 113 such as a reduction of the oxygen concentration of the cathode gas is made small in this way even at the estimation value $R_a$ of the reaction resistance of the anode electrode 112 calculated from the internal impedance Z, the accuracy of the hydrogen starvation state determination at the estimation value $R_a$ of the reaction resistance is further improved.

Further, if the predetermined frequency is selected from the frequency range of 20 Hz to 50 Hz, the difference between the reaction resistance $R_a$ during the hydrogen starvation and the reaction resistance $R_a$ during the oxygen starvation is 300 mΩ or larger. Thus, the above determination accuracy is further improved. Particularly, if the predetermined frequency is selected from the frequency range near 30 Hz, the difference between the reaction resistance $R_a$ during the hydrogen starvation and the reaction resistance $R_a$ during the oxygen starvation is 400 mΩ or larger. Thus, the above determination accuracy is most improved.

Further, the controller 6 calculates the reaction resistance $R_a$ of the anode electrode on the basis of the imaginary component $Z_{im}$ of the internal impedance Z. Since this eliminates the need to use the real component of the internal impedance Z in the calculation of the reaction resistance $R_a$, calculation becomes easier.

Particularly, the controller 6 plots two points on the coordinate system with $1/\omega^2$ represented on the horizontal axis and $-1/(\omega \cdot Z_{im})$ represented on the vertical axis using the frequencies $\omega_1$, $\omega_2$ and the measurement values $Z_{im1}$ and $Z_{im2}$ of the imaginary components of the internal impedances corresponding to the respective frequencies $\omega_1$, $\omega_2$, calculates a gradient and an intercept of a straight line obtained by connecting these two points and obtains the estimation value $R_a$ of the reaction resistance of the anode electrode 112 on the basis of the calculated gradient and intercept. Thus, the reaction resistance $R_a$ of the anode electrode 112 can be easily and quickly calculated from the above gradient and intercept without obtaining other parameters such as the electrolyte membrane resistance $R_m$.

It should be noted that the number of plot points (i.e. frequencies) on the aforementioned coordinate system may be three or more. By taking three or more plot points in this way and determining a straight line using an approximation method such as a least squares method, a highly accurate straight line greater matching actual values is obtained, with the result that the estimation value $R_a$ of the reaction resistance of the anode electrode 112 is also further improved.

Further, the controller 6 can also calculate the reaction resistance $R_a$ of the anode electrode on the basis of the real component $Z_{re}$ of the internal impedance. In this way, the estimation value $R_a$ of the reaction resistance can be calculated even without using the imaginary component $Z_{im}$ of the internal impedance Z.

Particularly, the controller 6 may obtain the real component $Z_{re}$ of the internal impedance, calculate an intercept of a straight line obtained from two or more points plotted on a coordinate system with $\omega^2$ represented on a horizontal axis and $1/(R_m - Z_{re})$ represented on a vertical axis and the electrolyte membrane resistance $R_m$ calculated in advance, and obtain the estimation value $R_a$ of the reaction resistance of the anode electrode 112 on the basis of the calculated intercept and electrolyte membrane resistance $R_m$. It should be noted that the number of plot points on the coordinate system may be two or more. By taking two or more plot points, a highly accurate straight line more matching actual values is obtained, with the result that the estimation value $R_a$ of the reaction resistance of the anode electrode 112 is also further improved.

If the electrolyte membrane resistance $R_m$ is, for example, calculated in advance to grasp a state such as the degree of wetness of the electrolyte membrane thought to largely influence properties of the fuel cell stack 1 in the calculation of the estimation value $R_a$ of the reaction resistance using such a real component $Z_{re}$ of the internal impedance, this can be utilized. Since the electrolyte membrane resistance $R_m$ calculated in advance can be utilized as it is in this way, the estimation value $R_a$ of the reaction resistance of the anode electrode 112 can be easily and quickly obtained.

Further, in the present embodiment, the controller 6 functions as the hydrogen starvation determination unit configured to determine the hydrogen starvation state in the anode electrode 112 on the basis of the calculated estimation value $R_a$ of the reaction resistance. If a state where hydrogen in the anode electrode 112 is lacking is determined by this, a power generation current is limited or power generation is stopped. In this way, the breakage of the electrodes and the like due to heat generated by continuing power generation as usual regardless of a lack of hydrogen can be prevented, and dangers can be avoided.

Furthermore, conventionally, measurement values of the internal impedances of the fuel cells and the cell voltages have been utilized to determine abnormalities of the fuel cells including the hydrogen starvation state. However, since it is cumbersome to measure each fuel cell, the above voltage and internal impedance have been measured for each unit composed of several cells or for each fuel cell stack 1 obtained by laminating about 10 cells depending on cases. In this case, if only one abnormal cell is present among a plurality of cells to be collectively measured, influences appearing in a total voltage measurement value and a total internal impedance measurement value of a plurality of cells are small. Thus, it has been difficult to find abnormalities of some of the cells.

In contrast, as a result of earnest studies of the present inventors, the estimation value $R_a$ of the reaction resistance of the anode electrode 112 according to the present embodiment was found to largely vary even if the hydrogen starvation state occurs only in some cells of the fuel cell stack 1. Thus, the existence of any abnormality of some cells in the fuel cell stack 1 is easily determined.

Further, the controller 6 functions as the hydrogen starvation state determination unit configured to determine the hydrogen starvation state in the anode electrode 112 on the basis of the calculated estimation value $R_a$ of the reaction resistance, whereby the hydrogen starvation state of the anode electrode 112 is determined if the reaction resistance $R_a$ exceeds the first hydrogen starvation determination threshold value $R_{TH1}$ and the controller 6 executes the control to increase the hydrogen supply amount if the reaction resistance $R_a$ is larger than the first hydrogen starvation determination threshold value $R_{TH1}$ and not larger than the second hydrogen starvation determination threshold value $R_{TH2}$ larger than the first hydrogen starvation determination threshold value $R_{TH1}$. In this way, when the second hydrogen starvation determination threshold value $R_{TH2}$ is exceeded before a lack of hydrogen is directly linked to a danger such as the breakage of the electrodes after the start of the lack of hydrogen, the hydrogen starvation state can be prevented by increasing the hydrogen supply amount. Thus, a situation such as the stop of power generation or the breakage of the battery due to a lack of hydrogen can be prevented.

Second Embodiment

A second embodiment is described below. It should be noted that, in the present embodiment, elements similar to those of the first embodiment are denoted by the same reference signs and not described. In the second embodiment, a more accurate calculation model is presented which takes into consideration the influence of an electrical double layer capacitance $C_c$ of a cathode electrode 113 in the calculation of an estimation value $R_a$ of a reaction resistance of an anode electrode 112.

Figure 12:
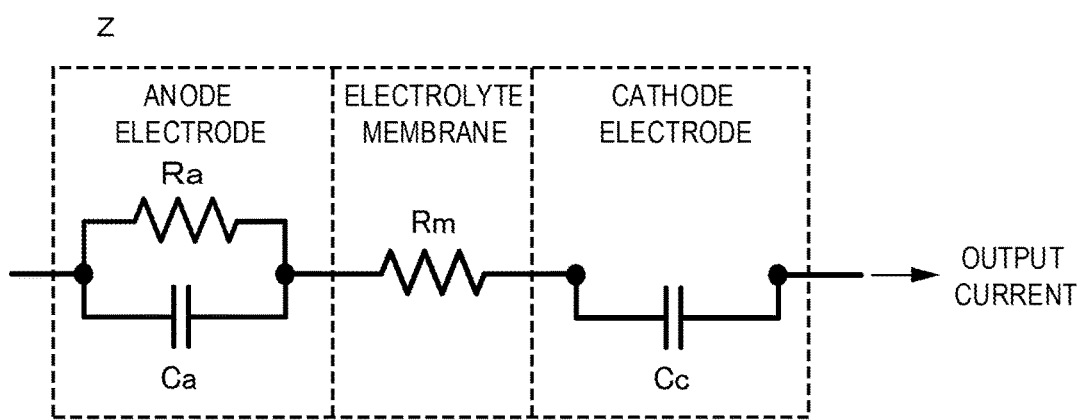
FIG. 12 is a diagram showing an equivalent circuit model of a fuel cell stack according to a second embodiment.

FIG. 12 is a diagram showing an equivalent circuit model of a fuel cell stack 1 according to the second embodiment. Accordingly, an equation expressing this equivalent circuit model is as follows.

[Equation 4]

$$Z = R_m + \frac{R_a(1 - j\omega C_a R_a)}{1 + \omega^2 C_a^2 R_a^2} - j\frac{1}{\omega C_c} \quad (4)$$

where Z denotes an internal impedance of a fuel cell stack 1, j denotes an imaginary unit, $\omega$ denotes an angular frequency of an alternating-current signal, $R_m$ denotes an electrolyte membrane resistance of a cell, $R_a$ denotes the reaction resistance value of the anode electrode 112, $C_a$ denotes an electrical double layer capacitance of the anode electrode 112, and $C_c$ denotes the electrical double layer capacitance of the cathode electrode 113. The calculation of the reaction resistance $R_a$ using Equation (4) is described below.

If only a real component $Z_r$ of the internal impedance in the above Equation (4) is taken out and changed, the following equation is obtained.

[Equation 5]

$$\frac{1}{Z_r} = \omega^2 C_a^2 R_a + \frac{1}{R_a} - \frac{R_m}{Z_r(Z_r - R_m)} \quad (5)$$

Further, if only an imaginary component of the internal impedance in the above Equation (4) is taken out and changed, the following equation is obtained.

[Equation 6]

$$Z_i = -\frac{\omega C_a R_a^2}{1 + \omega^2 C_a^2 R_a^2} - \frac{1}{\omega C_c} \quad (6)$$

It should be noted that the measurement of the real component $Z_r$ of the internal impedance and the measurement of the imaginary component $Z_i$ of the internal impedance can be conducted by similar methods in line with Steps S201 to S204 shown in FIG. 9 and Steps S101 to S104 shown in FIG. 6.

Accordingly, the calculation of the estimation value $R_a$ of the reaction resistance of the anode electrode particular to the present embodiment on the basis of selected two frequencies $\omega_1$ and $\omega_2$, measurement values $Z_{r1}$ and $Z_{r2}$ of real components of internal impedances corresponding to these two frequencies $\omega_1$ and $\omega_2$ and measurement values $Z_{i1}$ and $Z_{i2}$ of imaginary components of the internal impedances calculated on the basis of these two frequencies $\omega_1$ and $\omega_2$ is particularly described here.

Figure 13:
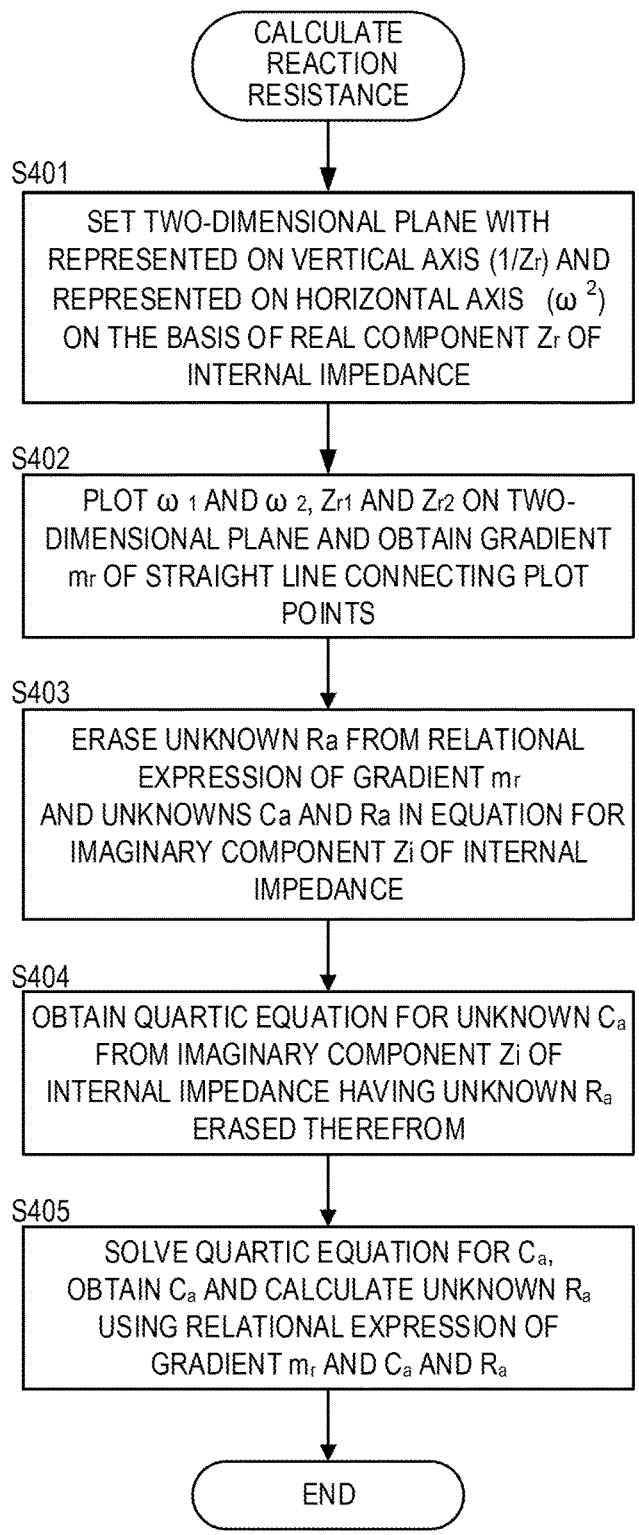
FIG. 13 is a flow chart showing an algorithm for calculating a reaction resistance of an anode electrode according to the second embodiment.

FIG. 13 is a flow chart showing an algorithm of calculating an estimation value $R_a$ of a reaction resistance of the anode electrode 112 according to the present embodiment. First, a two-dimensional plane with $(1/Z_r)$ represented on a vertical axis and $(\omega^2)$ represented on a horizontal axis in the above Equation (5) is set in Step S401.

In Step S402, the known two frequencies $\omega_1$ and $\omega_2$ and measurement values $Z_{r1}$ and $Z_{r2}$ of the real components of the internal impedances are plotted on the above two-dimensional plane and the value of a gradient $m_r$ of a straight line drawn by connecting these plot points is obtained. Thus, on the basis of the above Equation (5), the following equation is obtained.

[Equation 7]

$$m_r C_a^2 R_a \quad (7)$$

By transposing this equation, the following equation is obtained.

[Equation 8]

$$R_a = \frac{m_r}{C_a^2} \quad (8)$$

On the other hand, if $R_a$ of Equation (8) is substituted into the above Equation (6) and both sides are multiplied by $\omega$ in Step S403, the following equation is obtained.

[Equation 9]

$$\omega Z_i = -\frac{\omega^2 m_r^2}{C_a^3 + \omega^2 m_r^2 C_a} - \frac{1}{C_c} \quad (9)$$

In Step S404, the known frequencies $\omega_1$ and $\omega_2$ and the imaginary components $Z_{i1}$ and $Z_{i2}$ corresponding to these frequencies are respectively substituted into Equation (9) to obtain two equations, and the following quartic equation for the unknown electrical double layer capacitance $C_a$ of the anode, which erases the electrical double layer capacitance $C_c$ of the cathode, is obtained by taking a difference between these two equations.

[Equation 10]

$$C_a^4 + (\omega_1^2 + \omega_2^2) m_r^2 C_a^2 + \frac{\omega_1^2 - \omega_2^2}{\omega_1 Z_{i1} - \omega_2 Z_{i2}} m_r^2 C_a + \omega_1^2 \omega_2^2 m_r^4 = 0 \quad (10)$$

When the quartic equation of Equation (10) is solved in Step S405, two solutions $C_{a1}$ and $C_{a2}$, which are not imaginary numbers, are obtained. By substituting each of these solutions $C_{a1}$ and $C_{a2}$ into the above Equation (8), $R_{a1}$ and $R_{a2}$ are determined as candidates for the estimation value of the reaction resistance. The estimation value candidates $R_{a1}$ and $R_{a2}$ are as follows.

[Equation 11]

$$R_{a1} = \frac{4 m_r}{\left\{ \sqrt{t_1} + \sqrt{-t_1 - 2m_r^2\left(\omega_1^2 + \omega_2^2 + \frac{\omega_1^2 - \omega_2^2}{\sqrt{t_1}\,(\omega_1 Z_{i1} - \omega_2 Z_{i2})}\right)} \right\}^2} \quad (11)$$

$$R_{a2} = \frac{4 m_r}{\left\{ \sqrt{t_1} - \sqrt{-t_1 - 2m_r^2\left(\omega_1^2 + \omega_2^2 + \frac{\omega_1^2 - \omega_2^2}{\sqrt{t_1}\,(\omega_1 Z_{i1} - \omega_2 Z_{i2})}\right)} \right\}^2} \quad (12)$$

In Equations (11) and (12), $t_1$ is a constant defined as follows.

[Equation 13]

$$t_1 = \sqrt[3]{-\frac{27 A_0 + 2 A_2^3 - 9 A_2 A_1}{54} + \sqrt{\left(\frac{27 A_0 + 2 A_2^3 - 9 A_2 A_1}{54}\right)^2 + \left(\frac{3 A_1 - A_2^2}{9}\right)^3}} + \sqrt[3]{-\frac{27 A_0 + 2 A_2^3 - 9 A_2 A_1}{54} + \sqrt{\left(\frac{27 A_0 + 2 A_2^3 - 9 A_2 A_1}{54}\right)^2 + \left(\frac{3 A_1 - A_2^2}{9}\right)^3}}$$

Further, $A_2$, $A_1$ and $A_0$ in Equation are respectively constants defined as follows.

[Equation 14]

$$A_2 = 2(\omega_1^2 + \omega_2^2) m_r^2$$

$$A_1 = (\omega_1^2 + \omega_2^2)^2 m_r^4 - 4 \omega_1^2 \omega_2^2 m_r^4$$

$$A_0 = -\left(\frac{\omega_1^2 - \omega_2^2}{\omega_1 Z_{i1} + \omega_2 Z_{i2}}\right)^2 m_r^4$$

It should be noted that the above quartic equation of Equation (10) can be solved by a method such as the use of a quartic formula. Further, it is possible to check the calculated estimation values $R_{a1}$ and $R_{a2}$ against an actual event and examine them, and select one estimation value $R_a$ of the reaction resistance as appropriate. It should be noted that an average value of the above values $R_{a1}$ and $R_{a2}$ may be set as a true estimation value $R_a$.

In the controller 6 (state determination device) provided in the fuel cell system 100 of the present embodiment described above, the following effects can be obtained by calculating the estimation value $R_a$ of the reaction resistance of the anode electrode 112 by additionally considering the influence of the electrical double layer capacitance $C_c$ of the cathode electrode 113 as the equivalent circuit model of the fuel cell stack 1.

Specifically, since the estimation value $R_a$ of the reaction resistance of the anode electrode 112 is calculated on the basis of the more accurate equivalent circuit model of the fuel cell stack 1 in the present embodiment, the estimation value $R_a$ of the reaction resistance more accurately expressing an actual level of the hydrogen concentration of the anode electrode 112 can be obtained, with the result that the reliability of the low hydrogen concentration state determination is further improved.

Particularly, since the estimation value $R_a$ of the reaction resistance of the anode electrode 112 is calculated on the basis of both the real component $Z_r$ of the internal impedance $Z$ and the imaginary component $Z_i$ of the internal impedance in the present embodiment, the calculation of the estimation value $R_a$ of the reaction resistance of the anode electrode 112 can be more reliably and precisely performed.

It should be noted that, in the above second embodiment, the solution method of Equations (5) and (6) for calculating the estimation value $R_a$ of the reaction resistance of the anode electrode 112 is not limited to the above one and various other methods can be used. For example, three frequencies $\omega_1$, $\omega_2$ and $\omega_3$ and measurement values $Z_{r1}$, $Z_{r2}$ and $Z_{r3}$ of real components or measurement values $Z_{i1}$, $Z_{i2}$ and $Z_{i3}$ of imaginary components of actual impedances corresponding to these frequencies may be substituted into the real component $Z_r$ of Equation (5) or the imaginary component $Z_i$ of Equation (6) and the estimation value $R_a$ of the reaction resistance of the anode may be calculated from obtained three equations with $C_a$, $R_a$ and $C_c$ serving as unknowns.

Although the embodiments of the present invention have been described above, the above embodiments are merely an illustration of some application examples of the present invention and not intended to limit the technical scope of the present invention to the specific configurations of the above embodiments.

For example, although the configuration of the present invention is applied to the fuel cell stack 1 for supplying drive power to the travel motor 53 of the vehicle in the above embodiments, there is no limitation to this and the configuration of the present invention can be applied to arbitrary fuel cells used to supply power to load elements, for example, in personal computers, other vehicles and the like.

Further, various changes can be made in a circuit configuration and the like for measuring the internal impedance Z. For example, in the present embodiments, the alternating-current power supply 57 is caused to apply a voltage to the fuel cell stack 1, an output current is measured and an internal impedance is calculated on the basis of the applied voltage and the output current. However, a predetermined current source may be caused to supply an alternating current to the fuel cell stack 1, an output alternating-current voltage may be measured and an internal impedance may be calculated on the basis of the alternating current and the output alternating-current voltage.

Furthermore, actual values of the frequencies and reaction resistances illustrated in the present embodiments can be appropriately adjusted by a person skilled in the art in accordance with the materials, sizes, designs and the like of the electrodes and the like constituting the fuel cell, and are not necessarily limited to the values illustrated in the present embodiments.

For example, although a state where the hydrogen concentration of the supplied anode gas is 1% (oxygen concentration of the supplied cathode gas is 1%) and the cell voltage is about 0.25 V or lower is assumed as the hydrogen starvation (oxygen starvation) in the present embodiments, there is no limitation to this.

Specifically, if the influence of the reaction resistance component of the cathode electrode 113 can be evaluated to be sufficiently small to be negligible as compared to the influence of the reaction resistance component of the anode electrode 112 in the equivalent circuit of the fuel cell shown in FIGS. 4A to 4D, a state where the cell voltage is not higher than a predetermined value exceeding 0.25 V may be, for example, assumed as the hydrogen starvation or oxygen starvation.

Particularly, in the case of selecting the frequencies from the frequency range of 10 Hz to 100 Hz, more preferably the frequency range of 20 to 50 Hz and particularly the frequency range near 30 Hz as in the above embodiments, the influence of the reaction resistance component of the cathode electrode 113 can be evaluated to be negligible as compared to the influence of the reaction resistance component of the anode electrode 112 in a wide cell voltage range of higher than 0.25 V and lower than 0.5 V with reference to FIGS. 7A, 7B, 8A and 8B.

Further, although the hydrogen concentration of the supplied anode gas being 1% (oxygen concentration of the supplied cathode gas being 1%) is assumed as a premise of the hydrogen starvation (oxygen starvation), these assumed values of the hydrogen concentration and the oxygen concentration are merely examples and not intended to limit the gist of the present invention to these numerical values.

The invention claimed is:

1. A state determination device for a fuel cell for generating power upon receiving the supply of anode gas and cathode gas, comprising:
   an internal impedance measurement unit configured to measure an internal impedance of the fuel cell on the basis of an alternating-current signal of a predetermined frequency output from the fuel cell; and
   an anode reaction resistance estimation/calculation unit configured to calculate an estimation value of a reaction resistance of an anode electrode of the fuel cell on the basis of a measurement value of the internal impedance,
   wherein:
   the predetermined frequency is selected such that a difference between the estimation value of the reaction resistance of the anode electrode during hydrogen starvation and the estimation value of the reaction resistance of the anode electrode during oxygen starvation is not smaller than a predetermined value.

2. The state determination device for the fuel cell according to claim 1, comprising:
   an electrolyte wet/dry state measurement unit configured to measure a wet/dry state of an electrolyte membrane of the fuel cell on the basis of the measurement value of the internal impedance, wherein:
   the internal impedance measurement unit measures an internal impedance of a high frequency higher than the predetermined frequency; and
   the electrolyte wet/dry state measurement unit measures the wet/dry state of the electrolyte membrane of the fuel cell on the basis of a measurement value of the internal impedance of the high frequency.

3. The state determination device for the fuel cell according to claim 1, wherein:
   the anode reaction resistance estimation/calculation unit calculates the estimation value of the reaction resistance of the anode electrode by applying the measurement value of the internal impedance to an equation for an impedance based on an equivalent circuit model of the fuel cell.

4. The state determination device for the fuel cell according to claim 1, wherein:
   the anode reaction resistance estimation/calculation unit calculates the estimation value of the reaction resistance of the anode electrode on the basis of an imaginary component of the internal impedance.

5. The state determination device for the fuel cell according to claim 4, wherein the anode reaction resistance estimation/calculation unit:
   calculates the imaginary component $Z_{im}$ of the internal impedance on the basis of an equation determined by an equivalent circuit model of the fuel cell, the equation being as follows:

$$Z = R_m + \frac{R_a(1 - j\omega C_a R_a)}{1 + \omega^2 C_a^2 R_a^2} \qquad \text{[Equation 1]}$$

(where Z denotes the internal impedance of the fuel cell, j denotes an imaginary unit, $\omega$ denotes an angular frequency of the alternating-current signal, $R_m$ denotes an electrolyte membrane resistance value, $R_a$ denotes the estimation value of the reaction resistance value of the anode electrode and $C_a$ denotes an electrical double layer capacitance of the anode electrode); and
   plots two points using frequencies $\omega_1$ and $\omega_2$ and measurement values $Z_{im1}$ and $Z_{im2}$ of imaginary components of internal impedances corresponding to the respective frequencies $\omega_1$ and $\omega_2$ on a coordinate system with $1/\omega^2$ represented on a horizontal axis and $-1/\omega Z_{im}$ represented on a vertical axis, calculates a gradient and an intercept of a straight line obtained by connecting the two points and obtains the estimation value of the reaction resistance of the anode electrode on the basis of the calculated gradient and intercept.

6. The state determination device for the fuel cell according to claim 1, wherein:
   the anode reaction resistance estimation/calculation unit calculates the estimation value of the reaction resistance of the anode electrode on the basis of a real component of the internal impedance.

7. The state determination device for the fuel cell according to claim 6, wherein the anode reaction resistance estimation/calculation unit:
calculates the real component $Z_{re}$ of the internal impedance on the basis of an equation determined by an equivalent circuit model of the fuel cell, the equation being as follows:

$$Z = R_m + \frac{R_a(1 - j\omega C_a R_a)}{1 + \omega^2 C_a^2 R_a^2} \quad \text{[Equation 2]}$$

(where Z denotes the internal impedance of the fuel cell, j denotes an imaginary unit, ω denotes an angular frequency of the alternating-current signal, $R_m$ denotes an electrolyte membrane resistance value, $R_a$ denotes the estimation value of the reaction resistance value of the anode electrode and $C_a$ denotes an electrical double layer capacitance of the anode electrode); and
plots two points using frequencies $\omega_1$ and $\omega_2$, measurement values $Z_{re1}$ and $Z_{re2}$ of real components of internal impedances corresponding to the respective frequencies $\omega_1$ and $\omega_2$ and the electrolyte membrane resistance $R_m$ calculated in advance on a coordinate system with $\omega^2$ represented on a horizontal axis and $1/(Z_{re}-R_m)$ represented on a vertical axis, calculates an intercept of a straight line obtained by connecting the two points and obtains the reaction resistance estimation value $R_a$ of the anode electrode on the basis of the calculated intercept and the electrolyte membrane resistance $R_m$.

8. The state determination device for the fuel cell according to claim 1, wherein:
the anode reaction resistance estimation/calculation unit calculates the estimation value of the reaction resistance of the anode electrode on the basis of both a real component of the internal impedance and an imaginary component of the internal impedance.

9. The state determination device for the fuel cell according to claim 8, wherein the anode reaction resistance estimation/calculation unit:
calculates the real component $Z_r$ and the imaginary component $Z_i$ of the internal impedance on the basis of an equation determined by an equivalent circuit model of the fuel cell, the equation being as follows:

$$Z = R_m + \frac{R_a(1 - j\omega C_a R_a)}{1 + \omega^2 C_a^2 R_a^2} - j\frac{1}{\omega C_c} \quad \text{[Equation 3]}$$

(where Z denotes the internal impedance of the fuel cell, j denotes an imaginary unit, ω denotes an angular frequency of the alternating-current signal, $R_m$ denotes an electrolyte membrane resistance value, $R_a$ denotes the estimation value of the reaction resistance value of the anode electrode, $C_a$ denotes an electrical double layer capacitance of the anode electrode and $C_c$ denotes an electrical double layer capacitance of a cathode electrode), and calculates the reaction resistance estimation value $R_a$ of the anode electrode on the basis of measurement values $Z_{r1}$ and $Z_{r2}$ of internal impedance real components and measurement values $Z_{i1}$ and $Z_{i2}$ of internal impedance imaginary components at frequencies $\omega_1$ and $\sigma_2$.

10. The state determination device for the fuel cell according to claim 1, further comprising:
a hydrogen starvation state determination unit configured to determine a hydrogen starvation state in the anode electrode on the basis of the calculated estimation value of the reaction resistance of the anode electrode; and
a power generation control unit configured to limit a power generation current or stop power generation if it is determined by the hydrogen starvation state determination unit that the anode electrode is in the hydrogen starvation state.

11. The state determination device for the fuel cell according to claim 1, further comprising:
a hydrogen starvation state determination unit configured to determine a hydrogen starvation state in the anode electrode on the basis of the calculated estimation value of the reaction resistance of the anode electrode, wherein:
the hydrogen starvation state determination unit determines that the anode electrode is in the hydrogen starvation state if the calculated reaction resistance exceeds a hydrogen starvation determination threshold value; and
the state determination device further comprises a hydrogen supply amount control unit configured to execute a control to increase a hydrogen supply amount if it is determined by the hydrogen starvation state determination unit that the reaction resistance is larger than the hydrogen starvation determination threshold value and not larger than a predetermined reference value larger than the hydrogen starvation determination threshold value.

12. A state determination method for a fuel cell for generating power upon receiving the supply of anode gas and cathode gas, comprising:
measuring an internal impedance of the fuel cell on the basis of an alternating-current signal of a predetermined frequency output from the fuel cell; and
calculating an estimation value of a reaction resistance of an anode electrode of the fuel cell on the basis of a measurement value of the internal impedance,
wherein:
the predetermined frequency is selected such that a difference between the reaction resistance of the anode electrode during hydrogen starvation and the reaction resistance of the anode electrode during oxygen starvation is not smaller than a predetermined value.

* * * * *